US006326299B1

(12) United States Patent
Homma et al.

(10) Patent No.: US 6,326,299 B1
(45) Date of Patent: Dec. 4, 2001

(54) METHOD FOR MANUFACTURING A SEMICONDUCTOR DEVICE

(75) Inventors: Yoshio Homma, Tokyo; Seiichi Kondo, Kokubunji; Noriyuki Sakuma, Hachioji; Naofumi Ohashi, Hanno; Toshinori Imai, Ome; Hizuru Yamaguchi, Akishima; Nobuo Owada, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/361,989

(22) Filed: Jul. 28, 1999

(30) Foreign Application Priority Data

Nov. 9, 1998 (JP) .................................................. 10-317233

(51) Int. Cl.$^7$ ............................................... H01L 21/4763
(52) U.S. Cl. ........................... 438/633; 438/637; 438/648; 438/687; 438/692
(58) Field of Search .................................. 438/622, 627, 438/633, 637, 648, 687, 692, 693

(56) References Cited

U.S. PATENT DOCUMENTS

| | | |
|---|---|---|
| 4,944,836 | 7/1990 | Beyer et al. . |
| 5,397,741 * | 3/1995 | O'Connor et al. ................... 438/633 |
| 5,854,140 * | 12/1998 | Jaso et al. ............................ 438/740 |
| 5,926,732 * | 7/1999 | Matsuura ............................. 438/622 |
| 6,017,815 * | 1/2000 | Wu ...................................... 438/634 |
| 6,025,264 * | 2/2000 | Yew et al. ........................... 438/627 |
| 6,093,639 * | 7/2000 | Wu et al. ............................. 438/629 |
| 6,100,196 * | 8/2000 | Chan et al. .......................... 438/687 |

FOREIGN PATENT DOCUMENTS

| | | |
|---|---|---|
| 2-278822 | 11/1990 | (JP) . |
| 8-83780 | 3/1996 | (JP) . |
| 9-167768 | 6/1997 | (JP) . |
| 10-214834 | 8/1998 | (JP) . |

OTHER PUBLICATIONS

Proceedings of CMP–MIC Conference, Feb. 1997, pp. 415–422, Nishio, M., et al., "A New Type of Erosion in W–CMP."

M. Sun et al, "In Situ Detection of Film Thickness Removal During CMP of Oxide and Metal Layers," Feb. 22–23, 1996 CMP–MIC Conference 1996 ISMIC 100P/0256, pp. 256–262.

* cited by examiner

Primary Examiner—T. N. Quach
(74) Attorney, Agent, or Firm—Mattingly, Stanger & Malur, P.C.

(57) ABSTRACT

In order to suppress an increase of depressions, etc. to occur on a copper based alloy layer during polishing when a copper based alloy inlaid wiring is formed with the damascene method in grooves formed in an insulating film, the polishing rate for the lower metallic layer is set not less than five times faster than the etching rate for the same and the polishing rate for the insulating film is set lower than the polishing rate for the lower metallic layer when the upper metallic layer 13 to become a wiring and the lower metallic layer 12 to become a barrier are polished respectively. Thus, the object damascene wiring can be formed with less erosion on each of insulating layers and dishing on each of metallic layers respectively.

45 Claims, 9 Drawing Sheets

METHOD FOR MANUFACTURING A SEMICONDUCTOR DEVICE

BACKGROUND OF THE INVENTION

1. Field of the Invention

The present invention relates to a semiconductor device and a method for manufacturing the same, more particularly to a method for forming metallic wirings of a semiconductor device through polishing and a semiconductor device manufactured using the method.

2. Description of the Related Art

In recent years, planarization of the surfaces of wiring boards has been increasingly valued for large scale semiconductor integrated circuits (LSIs). One of the representative techniques for such the planarization is the Chemical Mechanical Polishing (CMP: hereafter, to be described as polishing otherwise specially defined), which is disclosed in, for example, the U.S. Pat. No. 4944836. According to this method, for example, a metal film for wiring is formed on a silicon substrate (wiring board) on which an LSI is to be formed, then the metal film is treated through well-known lithography and Reactive Ion Etching (RIE) techniques, thereby forming the object wiring pattern. After that, an insulating layer is formed on the wiring pattern. If the surface of the insulating layer is planarized through polishing, the fabrication accuracy of the wiring to be formed in the upper layer will be improved more effectively.

On the other hand, the damascene method that forms metallic wirings through polishing steps is also a focus of attention. According to the damascene method, an insulating film is formed on a wiring board at first, then grooves are formed in the insulating film for the wiring using both well-known lithography and RIE techniques. On the board with those grooves is then deposited a metal film for wiring. After that, the metal film except for the portion inlaid in each groove is removed through polishing, so that inlaid metal lines are formed there. This technique is disclosed in, for example, Japanese Patent Laid-Open No.2-278822. This method, which is effective especially when lines are to be formed with a copper based alloy whose fine fabrication by RIE is difficult, is also now under study as a method for fine fabrication of aluminum wiring patterns.

The details of the conventional damascene method are introduced in the official gazette of Japanese Patent Laid-Open No.10-214834 and in the publication of Proceedings CMP-MIC Conference (pp.415–422). Those examples describe a layered film consisting of tungsten and titanium respectively. Hereunder, the damascene method will be described on the basis of those examples with reference to FIG. 3. At first, an insulating layer 31 is formed on a wiring board 30 as shown in FIG. 3(a). Then, in the insulating layer 31 are formed depressions such as grooves or holes (to be referred to as grooves 32 generically) to be used as wirings and interlevel portions. After that, a lower metallic layer 32 and an upper metallic layer 33 are formed in order so as to cover the insulating layer 31. The lower metallic layer 32 consists of titanium and the lower metallic layer 33 consists of tungsten.

After that, both upper and lower metallic layers 32 and 33 except for the grooves are removed through polishing as shown in FIG. 3(b). Since the upper metallic layer 33 to be polished in the dense area of each groove pattern is substantially thinner than that of other areas provided with no pattern, the polishing of the upper metallic layer 33 is ended earlier in the pattern dense area than in other non-pattern areas. Therefore, when the lower metallic layer 32 and the first insulating layer 31 are exposed, part 33a of the upper metallic layer 33 still remains unfinished in each no-pattern area. And, if the polishing is continued until the lower metallic layer 32 is removed completely, phenomena referred to as erosion and dishing occur. The erosion means a phenomenon that the surface of the insulating layer 31 is depressed by a depth E1 more in each pattern dense area than in other non-pattern areas as shown in FIG.(c). The dishing means a phenomenon that the surface of the upper metallic layer 33 is depressed by a depth D1 more in each groove from the surface of the surrounding insulating layer 31. It is also reported that a localized erosion occurs at a depth of LE especially at each boundary between a pattern dense area and a no-pattern area. It is also reported that this localized erosion depends on the relative moving directions of both polishing platen and wiring board, as well as the type of the polishing pad, etc.

The reason why such a height difference occurs is explained as follows. Generally, a polishing agent for the layered metals causes the polishing rate to be reduced in order of upper metallic layer, lower metallic layer, and insulating layer. In particular, a significant difference appears between polishing rates for the lower metallic layer and the insulating layer. In most cases, the polishing rate of the insulating layer is only a factor of scores with respect to the polishing rate for the lower metallic layer. Since the polishing rates for the upper and lower metallic layers 32 and 33 are larger than that of the insulating layer such way, the surfaces of the upper and lower metallic layers 32 and 33 in each pattern dense area are depressed deeply from the surface for the insulating layer 31 when the polishing ends. Consequently, a large polishing force is concentrated effectively at each projection of the insulating layer 31.

The polishing of the insulating layer is thus accelerated in each pattern dense area according to this difference between such the polishing forces, thereby causing a large height difference. And, a total of such an erosion depth E1, a localized erosion depth LE, and a dishing depth D1 would often reach ½ of the initial depth of the groove. If an inlaid metal is used for wiring, therefore, such a depth will increase the resistance of the object wiring significantly. In addition, if an attempt is made to form a multi-layered wiring on this layer using the damascene method, the height differences generated by such the erosion depth E1, the localized erosion depth LE, and the dishing depth D1 will affect the wiring in the upper layer, causing the metallic layer to be left unpolished in each depression. And, this unpolished portion of the metallic layer causes short-circuits of the wiring in the upper layer.

There is a two-step polishing method proposed for minimizing the difference between polishing rates effectively by eliminating height differences as described above. Concretely, the polishing is finished once after the polishing of the upper metallic layer 33 is almost finished as shown in FIG. 3(d). Since the polishing rate for tungsten is five times faster than that for titanium, the polishing can be finished before the titanium film is removed completely. Next, the polishing agent is changed to another that contains silica abrasive powder and potassium hydroxide or ammonium hydroxide, thereby polishing the titanium of the lower metallic layer 32. The use of this polishing agent can almost equalize the polishing rate between the insulating film 31 and titanium. The polishing method will thus reduce the erosion depth E2 and the dishing depth D2 as shown in FIG. 3(d), thereby improving the planarization of the surface of the layer. This conventional two-step polishing method aims at elimination of polishing non-uniformity caused by the polishing of an upper or middle layer (titanium containing nitrogen, if necessary) by stopping the polishing (the first polishing) on the surface of the titanium film, which is a lower metallic layer. The first polishing is donefor layers including a thick tungsten film, which is an upper metallic layer, as well as a middle titanium nitride layer. The conventional two-step polishing method further aims at actual reduction of the non-uniformity of polishing only in the second polishing of the lower metallic layer. In the second polishing, the polishing rates for both lower metallic layer and insulating layer should preferably be equal or over. Actually, however, the polishing rate for the insulating layer is faster than or almost equal to that for the lower metallic layer. The conventional two-step polishing method also aims at reduction of the dependency of the polishing rate on pattern by equalizing both polishing rates. According to this polishing method, therefore, the planarization of the surface of the insulating layer is improved after the polishing. More concretely, the polishing of the insulating layer is increased significantly. Consequently, the residual insulating film becomes thinner contrarily in some cases. However, since such a structure is used mainly as plugs for interlevel connection conventionally after tungsten is inlaid in the film, it has been considered that a metallic layer should rather be protruded from the insulating layer surface as disclosed in the official gazette of Japanese Patent Laid-Open No.9-167768. Such way, the planarization of the surface of the insulating layer has been considered to be important even when the insulating layer is thinned.

The official gazette of Japanese Patent Laid-Open No.8-83780 discloses a polishing method for copper based alloys. The gazette also describes a polishing method for a copper based alloy film and a tungsten film, as well as favorable characteristics of a polishing agent, which are obtained when the polishing agent contains alumina abrasive powder, a metallic layer oxidizer, and etching chemicals. Concretely, while the surface of an object metallic layer is oxidized using an oxidizer, the oxide is removed mechanically by abrasion due to the friction with inorganic abrasive powder and polishing pad. This is accepted as a basic polishing mechanism. The etching chemical is used to increase the polishing of metallic layers. If such the etching chemical is added to a polishing agent, however, etching also proceeds onto the metallic layer in each groove which comes in contact with neither abrasive powder nor polishing pad, thereby the planarization of the surface is degraded. In order to avoid such a problem, corrosion-proof agent, i.e., inhibitors are added to the polishing agent. Dishing can be prevented by increasing the ratio of the polishing rate to the etching rate, thereby improving the fabrication accuracy. In this example, the pH (hydrogen exponent) of the polishing agent is assumed to be neutral. If a corrosion-proof agent is added to the polishing agent, however, the polishing rate is lowered significantly. More concretely, if a corrosion-proof agent is added by 0.1%, the polishing rate is lowered down to 10 nm/min. Consequently, the ratio between polishing and etching rates is not always increased in proportion to the concentration of the corrosion-proof agent. Since the actual polishing rate must be 100 nm/min or so, such the characteristics will not be suitable for practical uses. In order to avoid occurrence of such a dishing phenomenon, there is also proposed a substantially two-step polishing method, which polishes a copper based alloy at the room temperature, then polishes a barrier layer mainly by lowering the temperatures of both polishing platen and polishing agent, thereby changing the polishing characteristics.

The following polishing agents available on the market are well known. QCTT1010 (a product of RODEL Inc., to be mixed with a hydrogen peroxide solution when used) contains alumina abrasive powder to function as a polishing agent for copper based alloys. And, the following are well known as polishing agents for tungsten: SS-W2000 (a product of CABOT Inc., to be mixed with a hydrogen peroxide solution when used) including silica abrasive powder, WA-400 (a product of CABOT Inc., to be mixed with an FE-400 solution including ferric nitride when used) including alumina abrasive powder, MSW-1000 (a product of RODEL Inc., to be mixed with a hydrogen peroxide solution when used), XGB-5542 (a product of RODEL Inc., to be mixed with potassium iodate when used), etc. On the other hand, the polishing agents should preferably be alkaline in order to increase the polishing of the above-mentioned insulating film. Generally, each of those polishing agents contains silicon abrasive powder, ammonium hydroxide, and potassium hydroxide. Polishing of insulating films has been used for a long time and many products have appeared on the market. It is well known that the hydrogen exponent (pH) of the solution is changed depending on the concentration of ammonium hydroxide and potassium hydroxide, thereby the polishing characteristics are changed. In the official gazette of Japanese Patent Laid-Open No.10-214834, such a type polishing agent is used for polishing a titanium layer.

However, since this two-step polishing method makes the polishing rates for both lower metallic layer 32 and insulating layer 31 closer as described above with reference to FIG. 3, polishing of the insulating layer 31 is speeded up if a polishing agent in use consists of silica abrasive powder and an alkaline solution of potassium hydroxide, ammonium hydroxide, etc. Consequently, while the height difference on the surface of the insulating layer is reduced significantly, the no-pattern insulating layer 30 is also polished away when this method is used. The insulating film is thus thinned by a value $\Delta T$ shown in FIG. 3(*e*). And, the total of the erosion E2, the dishing depth D2, and the reduction $\Delta T$ in the film thickness will reduce each groove in depth significantly, as well as the inlaid metallic layer in thickness. The use of such an insulating layer for wiring will thus increase the resistance of the wiring. This is why the insulating film will not be satisfactory yet in quality.

The polishing rate for titanium used for the lower metallic layer 32 is actually almost the same as that for the insulating layer 30. The upper limit ratio between the polishing rates for both layers 32 and 30 is concretely described in the 0058 field as 120 nm/min for the polishing rate for titanium and 25 nm/min for the polishing rate for oxide films if potassium iodate is used for the polishing agent.

Consequently, the polishing rate for titanium becomes 4.8 times (120/25=4.8) that for oxide films. This polishing agent can be used as the first polishing agent. The second polishing agent should be another (0060 field), however. It will be understood therefore that the polishing rate of the second polishing agent for the lower metallic layer should preferably be almost equal to that for the insulating layer and must be not more than 4.8 times that for the insulating layer. In spite of this, if polishing is done excessively by ten or scores of % in consideration of the polishing rate distribution, the structure over a plurality of wiring boards, and the polishing rate variability in a large area wiring board, then the resistance of the wiring is varied significantly due to the variability of the grooves in depth in the wiring board, and by extension, due to the difference between the wiring layers in thickness. Thus, polishing selectivity for lower metallic layer, i.e., polishing rate ratio of that for lower metallic layer to that for the underlying insulating layer, of 4.8 or less will not be enough.

In order to form low-resistance wirings in uniform all over the surface of a wiring board, therefore, it is required to remove both upper and lower metallic layers from predetermined portions of the entire surface of the wiring board, for example, from the entire region in which wiring circuit elements are formed, without thinning the insulating layer 31 at all.

Under such the circumstances, it is an object of the present invention to form wirings by suppressing the degradation of their shapes so as to keep both yield and stability of the production satisfactorily when multilayered damascene wirings are formed by removing the first alloy layer. Each of the damascene wirings consists of an upper metallic layer, and a lower metallic layer which is effective as a barrier layer.

The official gazette of Japanese Patent Laid-Open No.10-214834 has never described chemical etching in polishing. It is thus unknown how much the etching proceeds chemically in the polishing process.

SUMMARY OF THE INVENTION (1) Firstly, the above object of the present invention is achieved by polishing the lower metallic layer faster than the underlying insulating layer in the second polishing process after the first polishing of the upper metallic layer is finished. Concretely, when the second polishing is done for the lower metallic layer 12 shown in FIG. 1(b) after the first polishing of the upper metallic layer 13 shown in FIG. 1(a), the lower metallic layer 12 is polished faster than the insulating film 11. Actually, the polishing rate for the lower metallic layer should preferably be not less than five times that for the underlying insulating film. In order to improve the polishing accuracy more significantly, the multiple of the polishing selectivity between those layers should preferably be increased up to 7 to 10. Principally, there is no upper limit for this ratio between those polishing rates. For example, if a polishing agent that contains no abrasive powder substantially is used for polishing the lower metallic layer, the selectivity between the polishing rates will exceed 10 easily. If the polishing selectivity of the layer to the underlying insulating film is increased such way, the underlying insulating film will be suppressed from thinning effectively, thereby reducing the wiring resistance. In this specification, a polishing agent including no abrasive powder substantially shall mean a polishing agent containing an amount of abrasive powder of not more than 0.1 wt %.

Hereunder, changes of such a polishing process with time will be described with reference to FIG. 4. In order to simplify the description, it is premised that the subject wiring consist of two layers (upper and lower metallic layers). In the first polishing, the upper metallic layer is polished quickly. Then, if the polishing rate for the lower metallic layer is low as shown in FIG. 4(a), the polishing stops almost on the surface of the lower metallic layer actually. Excess polishing will affect little on the shape of those layers even when it is done. After that, the second polishing is done. The polishing rate for the insulating layer is lower significantly than that for the lower metallic layer. Consequently, the polished thickness is very small for the insulating layer at a portion where the maximum polished thickness appears by the polishing rate deviation even when excessive polishing is further done by more 10% or 20% after the polishing is finished at a portion where the polishing is done at the minimum (Min) rate. The depth variability is reduced in proportion to an increase as the polishing selectivity. If the polishing rates of both lower and upper metallic layers are almost equal, the first polishing is finished almost on the surface of the insulating layer without doing any excess polishing as shown in FIG. 4(b). The first polishing may be finished when the polishing is carried out for the time period estimated to be needed to remove the metallic layers by using average polishing rate. Though the insulating layer will be polished away slightly, the polished thickness is suppressed small almost in inversely proportion to the polishing selectivity of the upper or lower metallic layer to the underlying insulating layer. After that, the second polishing is done thereby to remove the lower metallic layer. Excess polishing nay be done by more 10% or 20% after the polishing is finished at the minimum (Min) polishing rate portion. In this case, the deviation of the groove depths will be increased slightly more than in the case shown in FIG. 4(a). However, since the polishing rate for the insulating layer is lower significantly than that for the lower metallic layer in this case, the variability is reduced far more than that of the conventional technique. In the case where the effect of the present invention is very distinct, the depth variability including dishing and erosion can be reduced to $1/3$ to $1/5$ of the conventional one.

(2) Secondly, the above object of the present invention is achieved by polishing the lower metallic layer (in the second polishing process) faster, concretely five times or more faster than the etching rate for the upper metallic layer, after the first polishing of the upper metallic layer is finished. Conventionally, it has been said that if the polishing selectivity is set so that the polishing rate for the lower metallic layer becomes faster than that for the insulating layer, the surface of the lower metallic layer is depressed, thereby the planarization is degraded on the contrarily. Inventors of the present invention are aware of the point that polishing is done with a combination of a chemical effect and a mechanical abrasive effect. If the chemical effect is added to the mechanical abrasive effect for polishing, therefore, etching will proceed more or less due to a chemical reaction of components in the polishing agent with a metallic layer during the polishing. This etching rate affects the polishing accuracy significantly. If the etching rate for the upper metallic layer is large, the upper metallic layer 33 will be depressed as shown in FIG. 3(e) when the lower metallic layer 32 is polished. As a result, dishing and erosion, which are especially problems in the damascene method, will occur. Concretely, the ratio of the polishing rate for the lower metallic layer to the etching rate for the upper metallic layer should be not less than 5, more preferably not less than 10. In addition, the ratio should preferably be not less than 15 if the wiring layer thickness needs being kept in highly uniform all over the surface of the object wiring board.

(3) Thirdly, the above object of the present invention is achieved by etching the upper metallic layer during the first polishing at not more than $1/5$, more preferably at not more than $1/10$ of the polishing rate for the upper metallic layer, then carrying out the second polishing for the lower metallic layer. Such the polishing method will make it easier to control the polishing of the upper metallic layer, as well as remove the lower metallic layer stably. Of course, in addition to those polishing conditions, the etching rate for the upper metallic layer should be set to not more than $1/5$, more preferably at not more than $1/10$ of the polishing rate for the lower metallic layer.

According to the method described in (2) or (3), the insulating layer is polished away only very slightly during the first or second polishing, since the pH of the polishing agent is acid. In this specification, an area whose pH value is not more than 7.5 and not less than 6.5 shall be referred to as a neutral area and an area whose pH value is below 6.5 is referred to as an acid area. And, an area whose pH is over 7.5 is referred to as an alkaline area.

In order to increase the rate ratio of the polishing rate to the etching rate, the following method is usable. Generally, a polishing rate is increased in proportion to an increase of the polishing force and the rotational speed of the polishing platen in addition to the characteristics of the object polishing agent. On the other hand, an etching rate does not depend so much on the polishing force, etc.; it is decided almost by the characteristics of the object polishing agent. Consequently, the conditions of the polishing force and the rotational speed of the platen should be set large. If a low polishing force is needed, the etching speed should also be low for the object polishing agent.

(4) Fourthly, the above object of the present invention is achieved by providing a semiconductor device, wherein the lower metallic layer inlaid in the groove or via hole of the insulating film is formed so as to become higher than the surface of the upper metallic layer formed in the groove or via hole. Such a structure of the semiconductor device will make it possible to prevent the upper metallic layer from coming in contact directly with the insulating film formed on the side wall, thereby improving the reliability thereof.

FIG. 2(d) shows details of an end of an inlaid wiring pattern formed in accordance with the present invention. The edge of the surface 25 of the insulating film 21, which is in contact with a metallic layer 22 and 23, has a slight tilting portion generated due to a friction with a polishing pad. The tilting angle is not more than 1°. At the end portions 24 of both upper and lower metallic layers, the polished surface of the lower metallic layer 22 is equal to or slightly lower than the polished surface of the insulating layer 21. The height difference between them is not more than 5 nm, however. The polished surface of the upper metallic layer 23 is also 5 to 10 nm lower than the polished surface of the lower metallic layer 22. This is because the upper metallic layer 23, which consists of copper, is very easy to be etched, thereby the upper metallic layer is also etched slightly when it is polished. However, the tilting angle of the polished surface of the upper metallic layer 23 is not more than 1° in the direction it goes away from the lower metallic layer 22; the wiring layer is formed such accurately.

The configuration of the above-described invention is determined by the characteristics of the polishing to be described below.

The present inventor, et al, have found that it is possible to control both polishing rate and etching rate set for an object polishing agent respectively almost independently of each other without changing the polishing temperature including that of the wiring board if the composition of the polishing agent is selected properly. It will thus be understood that it is possible to reduce occurrence of erosion and dishing phenomena, as well as localized depressions (localized erosion) significantly without increasing the polishing rate for the object insulating layer.

Hereunder, description will be made for the findings with respect to why an etching rate set for a polishing agent is important. Generally, an etching rate is measured while the polishing agent solution is static. (This is why this etching rate is also referred to as a static etching rate.) In an actual polishing process, however, the polishing agent is moved fast on the surface of the object wiring board. The moving speed is 10 to sores of meters/min. The inventor of the present invention, et al, have found that the etching rate of a solution, while it is moved fast, becomes several times faster than that in the static state. In addition, if polishing is to be done for a plurality of metallic layers, each etching rate of those metallic layers must be taken into consideration to decide the etching rate. In this case, it is assumed that there are only two metallic layers (upper and lower). The number of metallic layers is varied freely, of course. At first, the first polishing is carried out for the upper metallic layer. When the first polishing is finished, both upper and lower metallic layers appear on the surface of the wiring board. Generally, the first polishing must be done excessively. And, the etching rate for the upper metallic layer must be lower than the polishing rate for the upper metallic layer so as to suppress the dishing to occur in the upper metallic layer during this excessive polishing. The ratio of the polishing rate to the etching rate should be not less than 5, preferably not less than 10.

The etching rate for the lower metallic layer should also be set lower than the polishing rate for the upper metallic layer so as to suppress the dishing of the lower metallic layer. This is not required, however, if there is provided means for forming a protection layer, etc. after the second polishing to be described later even when dishing appears in the lower metallic layer due to etching. In this case, however, the damascene wiring process will become complicated. On the other hand, in the second polishing process, polishing is started while both the upper and the lower metallic layers exist and continued until the lower metallic layer formed on the insulating layer surface is removed. Consequently, the polishing rate for the lower metallic layer must be set faster for the second polishing agent than the etching rate for both upper and lower metallic layers. The ratio of the polishing rate to the etching rate should also be not less than 5, preferably not less than 10. In addition, the ratio should be not less than 15 if the increase of the resistance of the wiring has to be suppressed sufficiently, and the resistance of the wiring must be kept highly in uniform all over the surface of the wiring board having a large area whose diameter is not less than 150 mm.

It was thus found that using such a polishing agent could protect the surface of the object metallic layer from depression negligibly during polishing even when the ratio between the polishing rate selectivity for the metallic layer against for the insulating layer was large. Accordingly, it was also found that occurrence of both erosion and dishing phenomena could be suppressed. Generally, the following ratio is obtained with respect to the erosion etching rate between static and stirring states. For such a metal as a copper based alloy which is chemically reactive, many of conventional polishing agents have strong etching properties. Such a polishing agent with strong etching properties gives a large etching rate in the static state. Usually, the etching rate exceeds 5 nm/min in the static state. In the stirring state, it becomes 5 to 10 times that in the static state. Since the etching action on the surface of a copper based alloy is strong, the etching rate seems to be increased significantly when the polishing agent is stirred so as to keep supplying of a fresh solution. It was thus found in the tests performed by the present inventor, et al., the etching rate in stirred states became two times at highest to that in static state, when the different slurry which has very small static etching rate, for example, not more than 5 nm/min, was examined.

For titanium, tungsten, or a compound of those, the chemical reaction was low relatively. Consequently, the ratio of the etching rate in the stirring state to that in the static state was kept at two times or so in many cases. In this case, however, since the polishing rate is also low, the ratio of the polishing rate to the etching rate in the stirring state becomes important. If such a ratio is not less than 10, the etching properties are judged to be low.

In this specification, an etching rate means a value obtained principally while the polishing agent solution is stirred so as to imitate the circumstance during polishing.

Next, description will be made for an embodiment of the present invention with reference to FIG. 5, that is, how to obtain the first and second polishing agents, both of which are substantially the same in contents and only the concentration of the BTA (Benzotriazole) used as a copper corrosion-proof agent is changed therein, although they are used for the first and second polishing processes separately. Both polishing and etching rates slow down according to an increase of the concentration of the BTA. However, how much each of those rates slows down depends on the type and concentration of the organic acid contained in the polishing agent or the concentration of the oxidizer. Generally, the effect of BTA addition to the slurry is distinct if the original slurry in which BTA is not added has strong etching properties. The effect is less distinct, on the other hand, if the original slurry has weak etching properties.

The suitable concentration of the BTA to obtain the allowable etching and polishing properties changes depending on the slurry. In FIG. 5, a relative BTA concentration of 1.0 means a concentration at which the polishing rate of a copper based alloy becomes not more than about 10% of the polishing rate when no BTA is added to the polishing agent for convenience's sake. In FIG. 5, if the corrosive property of an original polishing agent is high, the suitable concentration may be within a relative ratio of 0.01 to 0.3. If the slurry originally has low corrosive properties, the BTA concentration may become 0.05 to above 0.7. The BTA concentration may be increased for the second polishing agent for the second step polishing more than for the first polishing agent. If such second polishing agent is used, the polishing rate for the lower metallic layer will not depend on the BTA concentration so much. This method will thus make it possible to obtain the second polishing agent that takes a faster polishing rate for the lower metallic layer and a lower polishing rate for the upper metallic layer and the insulating layer using high BTA concentration portions. The polishing rate for the lower metallic layer is changed to two or three times, however, depending on the type of the metal/compound. Preferably, therefore, a polishing agent that can contain different types organic acid as needed should be selected.

If the first polishing agent contains no abrasive powder substantially, the lower metallic layer will hardly be polished. In such a case, only a slower polishing rate of the second polishing agent is required for the insulation layer, and the second polishing agent may be any of the polishing agents either of low concentration portions or of high concentration portions shown in FIG. 5.

Classification between high corrosivity and low corrosivity for polishing agents is not universalized. In the present invention, with the respect to the first polishing agent for the upper metallic layer, low corrosivity is defined as an etching rate not more than 5 nm/min for the upper metallic layer in the static state.

Next, the processes described above will be described concretely.

(1) In the first method, the first polishing process is carried out for not only the upper metallic layer, but also for the lower metallic layer. If the upper metallic layer consists of a copper based alloy, almost all the above-described polishing agents available on the market can be used if they contain a hydrogen peroxide solution as an oxidizer. In the case of those polishing agents, the ratio of the polishing rate for the upper metallic layer to that for the lower metallic layer (tungsten, titanium, tantalum, and an alloy of those substances) is generally within ±150%. Since generally, the etching rate for the upper metallic layer is fast, for example, commonly scores of nm/min, resulting in the rate ratio of the polishing rate for the upper metallic layer to the etching rate for the upper metallic layer is usually 3 to 5, the loads of the corrosion inhibitor are thus adjusted as needed, thereby controlling the etching rate so that the ratio of the polishing rate for the upper metallic layer to the etching rate for the upper metallic layer is improved to not less than 5, more preferably to not less than 10. The through-put can be improved, thereby reducing the polishing time for the upper metallic layer while watching the etching rate not so as to be reduced excessively at this time.

If a polishing agent is used for both upper and lower metallic layers, excess polishing should be avoided in the first polishing step. On the other hand, if it is misjudged that the entire polishing is finished while part of the lower metallic layer is left unpolished, a short-circuit will occur between metallic wirings, thereby deteriorating the yield of wirings patterns. This is also a disadvantage of the conventional one-step polishing method. To avoid this disadvantage, therefore, the first polishing step is finished with less excess polishing, then the second polishing is started. In this case, the second polishing agent must satisfy the condition that the polishing rate for the lower metallic layer becomes five times faster than the polishing rate for the insulating layer. This is to suppress thinning of the insulating layer in excess polishing. If the main surface of the insulator is planarized enough before polishing, the polishing rate for the lower metallic layer to that for the insulating layer should be not less than seven times, preferably not less than 10 times. On an actual wiring board, however, depressions up to around 100 nm are left as are in some cases. And, in order to remove the metallic layer from such depressions, the etching properties of the polishing agent must be improved or the insulating layer is polished away until the surface becomes planarized. If the latter method is adopted, the polishing rate for the insulating layer is set to seven to ten times faster than that for the lower metallic layer, thereby shortening the second polishing time. The relationship between the polishing rates for the insulating layer and the upper metallic layer is not so closely related, but the polishing rate for the insulating layer should preferably be not more than ⅓ of that for the upper metallic layer so as to take excess polishing into consideration.

When the lower metallic layer is to be polished, the ratio of the polishing selectivity for the upper metallic layer to that for the lower metallic layer may be adjusted according to the conditions of the first polishing process for the upper metallic layer, as well as according to planarity of the surface of the object insulating layer surface.

This completes the description for how to polish the upper and lower metallic layers. More concretely, it is premised in the above description that the upper metallic layer consists of, for example, copper or a copper based alloy and the lower metallic layer consists of, for example, titanium, tantalum, tungsten, or compounds with nitrogen and/or silicon. The lower metallic layer must not always be a single layer; it may be a laminated film consisting of two or more layers. For the lower metallic layer, tantalum, titanium, and the compounds with nitrogen will be suitable from the viewpoint of adhesive and barrier properties, but tungsten and the compound with nitrogen or nitrogen and silicon will be suitable from the viewpoint of film forming and polishing easiness.

Hereunder, description will be made for a method for materializing a polishing agent having predetermined characteristics, which enable the first method described above. The first polishing agent may be obtained by adding a very small amount of an inhibitor (protection layer forming agent) to any of the polishing agents available on the market, which contains alumina and silica abrasive powder, as well as a hydrogen peroxide solution and an organic acid as etchant chemicals. The composition of the first polishing agent is not limited only to that, of course; any other polishing agents than those available on the market may be used, and various types of organic acids and inhibitors may be added to any of those polishing agents as needed.

In the present invention, the inhibitor is selected from Benzotriazole (hereafter, to be described as BTA), BTA derivatives such as carboxylic acid, etc., dodecanethiol, Triazole, Tritriazole, and derivatives or compounds of those substances. Among those substances, the BTA is the most effective and provides a stable effect. In the present invention, it is generally confirmed that addition of an amount of 0.01 wt % to 0.05 wt % to the object polishing agent will be enough, although it depends on the type of the polishing agent. In order to avoid the reduction of the polishing rate to be caused by addition of such an inhibitor (protection layer forming agent), the second inhibitor (protection layer forming agent) is added to the polishing agent as needed. The second inhibitor (protection layer forming agent) is selected from poly-acrylic acid, poly-methacrylic acid, ammonium acid salts and compounds of those substances, or ethlenediaminetetraacetic acid. If such a substance is added to the object polishing agent, favorable low etching characteristics will be obtained even when the concentration of the first inhibitor (protection layer forming agent) is lowered. It is thus possible to avoid the reduction of the polishing rate. Although it depends on the type of the polishing agent, predetermined low etching characteristics can be obtained if the concentration of the first inhibitor contained in the first polishing agent is not less than 0.01 wt % and not more than 0.05 wt %. With those methods described above, the rate ratio of the polishing rate to the etching rate with respect to the upper metallic layer can secure 10 or over. The polishing rate for the underlying insulating layer can thus be suppressed from increasing, since the pH of the polishing solution is kept weakly acid or acid.

The required characteristics for the second polishing agent can be obtained by using, for example, a commercially available polishing agent or another type commercially available polishing agent, each of which is the same as the first polishing agent, as well as a polishing agent containing a hydrogen peroxide solution as an oxidizer and the above organic acid. The polishing rate for the lower metallic layer must be not less than 10 times faster than the etching rate for the upper metallic layer. In addition, the polishing rate for the upper metallic layer should preferably be not more than 150% of that for the lower metallic layer. The first inhibitor contained in the second polishing agent is adjusted so that its concentration becomes not less than 0.04 wt % and not more than 1 wt %. If such the first polishing agent is used also as the second polishing agent, it is only needed to increase the concentration of the first inhibitor (protection layer forming agent) to be added to the object polishing agent. In this case, the polishing rate for the upper metallic layer can be suppressed equally to or not more than the polishing rate for the lower metallic layer. Generally, the necessary characteristics will be obtained only by increasing the concentration of the first inhibitor by not less than 0.01 wt % than the first polishing agent. For example, if the concentration of the first inhibitor added to the first polishing agent is 0.04 wt %, the concentration of the first inhibitor contained in the second polishing agent must be not less than 0.05 wt %. If the concentration of the inhibitor added to the first polishing agent is 0.05 wt %, the concentration of the inhibitor contained in the second polishing agent must be 0.06 wt %. If the concentration of the inhibitor is increased, the polishing rate for the lower metallic layer is a little reduced. However, since both polishing and etching rates for the upper metallic layer are also reduced significantly at this time, the characteristics can further be improved appropriately if the improvement of the fabrication shape accuracy is focused. Since the solubility to water is low for many of inhibitors, it is difficult technically to solve a high concentration inhibitor in water. Practically, satisfactorily low etching characteristics were obtained for any polishing agent if the inhibitor was added by not not less than 0.1 wt %, around 1 wt % in maximum.

The addition of the above inhibitor is intended to obtain suitable characteristics to polish the lower or upper metallic layer using the first polishing agent. The concentration of the first inhibitor contained in the first polishing agent is adjusted so as to keep the polishing rate at not more than 95% and not less than 40% of the polishing rate for the upper metallic layer when the inhibitor is not contained in the polishing agent. In this case, therefore, obtainment of the polishing characteristics takes precedence over the absolute value of the concentration. As for the second polishing agent, the polishing rate for the insulating layer could be controlled to 1/5 to 1/10 of the polishing rate for the lower metallic layer, since the pH of the second polishing agent was weakly acid or acid. If there are depressions of not less than several nm in depth and not more than 10 $\mu$m in width in an area on the surface of the insulating layer, where wiring patterns would not be made, those depressions must be eliminated by polishing this insulating layer in the second polishing process. If there is no such depression, which causes troubles in polishing, in a predetermined area, the fabrication shape of the inlaid wiring will be formed at a favorable accuracy, when the concentration of the first inhibitor contained in the second polishing agent is adjusted so as to control the polishing rate for the upper metallic layer to not more than 30% of that when the first inhibitor is not contained in the polishing agent. If the first and second polishing agents consist of the same main components and simply include a different inhibitor from each other, the polishing is done using the first polishing agent, then the second polishing agent is poured on the same polishing platen for starting the second polishing. The above method has an advantage that a mixture of those polishing agents will not affect the polishing badly. If the pH of the second polishing agent is not less than 1 and not more than 6, the lower metallic layer can be polished selectively by suppressing the polishing rate for the insulating film.

The second polishing process can also be carried out using a polishing agent that contains no abrasive powder substantially. That means the abrasive powder is inorganic and whose concentration is not more than 0.1 wt %. The polishing agent used in the first polishing process may be equivalent to that used in the above method. The second polishing agent contains an organic acid used as an etching agent, as well as an oxidizer. The first inhibitor used for the upper metallic layer is then added as needed. The organic acid should be an acid to be absorbed onto the surface of the lower metallic layer. Such an organic acid is, for example, malonic acid, fumaric acid, malic acid, adipic acid benzoic acid (e.g., 4-cyano benzoic acid), phthalic acid, uric acid, oxalic acid, tartaric acid, lactic acid, succinic acid, citric acid. Otherwise, the second polishing agent should contain at least one of salts or compounds obtained from reaction of those acids with ammonium. In particular, malonic acid, phthalic acid, adipic acid, or each of the salts with ammonium is suitable for the treatment. The concentration of each of those substances may be not more than about 0.1 wt %. Inorganic acids such as nitric acid, sulfuric acid, phosphoric acid, etc. may be added so as to adjust the pH and the etching rate. Such a polishing agent will be able to polish away the lower metallic layer even when no inorganic abrasive powder is contained substantially.

For such a polishing agent that contains those acids, the etching rate for the first and second metallic layers is kept at not more than $1/10$ of the polishing rate only with difficulty. Consequently, the dishing to appear on both the lower and the upper metallic layers will become larger than those in the above example.

The use of such the second polishing agent will, however, be effective to reduce the polishing rate for the insulating layer far from $1/10$ of the polishing rate for the lower metallic layer. The increase of erosion to appear on the insulating layer can thus be ignored. Tungsten or an alloy including tungsten are suitable for the lower metallic layer, since the polishing rate can be set faster especially so as to be suitable for the treatment.

(2) Next, the second method will be described. In this second method, the first polishing agent hardly polishes the insulating layer and the lower metallic layer. In this case, the upper and lower metallic layers are polished completely independently of each other. The characteristics of such the first polishing agent can be obtained by adjusting the concentration of the inorganic fixed abrasive powder contained in the polishing agency to not more than 0.1 wt %, which means that no inorganic fixed abrasive powder is contained substantially. If such a polishing agent that contains no abrasive powder is used, the object metallic layer can be polished at a practical rate, while the lower metallic layer and the insulating layer can be polished at a rate of not more than $1/10$ of that for the upper metallic layer. The polishing of the upper metallic layer stops effectively when the lower metallic layer or the insulating layer is exposed. Even after the upper metallic layer is removed completely with excess polishing carried out enough, at least part of the lower metallic layer remains unpolished.

In the second polishing process for the lower metallic layer, either the first or second polishing agent described in the first method can be used as the second polishing agent.

When any of those first and second polishing agents is used, the polishing rate for the lower metallic layer must be faster than the etching rate for the upper metallic layer. Concretely, if the nominal plane of the insulating layer is planar enough, the polishing selectivity for the lower metallic layer to that for the upper metallic layer may be 3 to 5, more preferably not less than 10. The above ratio may be 0.5 to 3 or so if the surface of the insulating layer, before polishing, has depressions in various sizes of not less than 5 nm in depth, for example, scratch-like depressions of not more than 1 micron in width and 1 to 5 microns in length, as well as wide and gentle depressions of not less than 5 microns in width and not less than 10 microns in length. This is to polish the surface of the insulating layer up to the depth equal to each of those depressions. Even when the above ratio is 3 or over, the lower metallic layer can be removed only with slight excessive polishing. In this case, although the processing performance is degraded, resulting in an increase of the polishing cost, no problem will arise from the point of the fabrication accuracy.

There is also another method for using the first and second polishing agents including no inorganic abrasive powder substantially. The first polishing agent can be one of the above described polishing agents which do not contain inorganic abrasive powder substantially. The second polishing agent may be also the one for polishing the lower metallic layer, which do not include the above inorganic fixed abrasive powder substantially. The characteristics and results of polishing performed using each of the first and second polishing agents are almost the same as those in the method described above. According to this method, the polishing rate for the lower metallic layer using the second polishing agent is apt to become lower than when the polishing agent which contains inorganic abrasive powder is used. The etching rate is also apt to increase in this case. Consequently, the rate ratio of the polishing rate to the etching rate is lowered. The through-put of the polishing is also a little degraded. Those are the disadvantages of this method. On the other hand, such the second method also has the following advantages; being free of such problems as packing in the polishing agent distributor and the drain system to be caused by settling of the abrasive powder, since both first and second polishing agents contain no inorganic abrasive powder substantially, as well as becoming easier in waste treatment. The method can thus reduce the cost of the whole polishing process significantly. Since a polishing agent that contains no abrasive powder substantially hardly polishes the insulating layer, such a polishing agent can have an advantage for reducing erosion.

In addition, the well-known endpoint monitoring method can be used to detect the end point of the polishing of each metallic layer. For example, the 1996 Proceedings First International Chemical Mechanical Polish (pp.256–262) describes an optical method for detecting end points of polishing. Concretely, since the reflectivity of light differs between lower and upper metallic layers, changes of the reflected light strength can be detected when the lower metallic layer is exposed. If a polishing process proceeds, thereby the lower metallic layer is polished away, so that the underlying insulating layer is exposed, then the change of the reflected light intensity is changed more remarkably. There is also a method for detecting such end points of polishing by detecting changes of a torque for rotating the polishing platen and the wiring board carrier during polishing. If the object polishing agent contains no abrasive powder, very small no mechanical friction due to abrasive powder occurs, and the torque change due to film layer change can be detected very easily.

When in polishing of the upper or lower metallic layer, generally, a polishing rate distribution within about ±10% appears within a wiring board. Consequently, part of the metallic layers will be left unpolished in some cases even when an end point detector is used to judge end points of polishing,. In such a case, it is only needed to repeat polishing of each metallic layer properly using the first and second polishing agents.

Of course, a different polishing platen should preferably be used for each of the first and second polishing agents, since the characteristics differ between those agents as described above. In particular when one of the first and second polishing agents contains no abrasive powder substantially and the other contains abrasive powder, a different polishing platen should be used for each of them so as to avoid the interaction between them. It is also possible for them to share a polishing platen, of course. Even in such a case, the second polishing process will not be affected by the first polishing process so much, since the concentration of the first inhibitor for the upper metallic layer is higher in the second polishing agent than in the first polishing agent. If a plurality of wiring boards are to be treated continuously, however, a high concentration of the inhibitor will cause the polishing of the upper metallic layer unstable. To avoid such a problem, therefore, a measure should be taken to lower the concentration of the inhibitor beforehand. The measure may be, for example, pouring pure water and a solution including a low concentration inhibitor on the surface of the polishing pad, as well as removing the abrasive powder and the inhibitor (protection layer forming agent) from the surface of the polishing pad using a diamond plate, a brush, etc. Although the present invention uses the upper metallic layer consisting of a copper based alloy, the same polishing conditions may also apply to an aluminum based alloy, which reacts with chemicals strongly. Also in this case, the same favorable result will be assured.

The methods described above are all for polishing object layers using a polishing agent that contains inorganic abrasive powder or a polishing agent that contains no inorganic abrasive powder substantially while the wiring board, pressed against the polishing pad, is moved. On the contrary, there is also another applicable method, which is an intermediate one between those two methods. The method uses a sheet including inorganic fixed abrasive powder on the polishing pad. In a broad sense, such a sheet is included in the resin bonded whetstone. The sheet is placed on the surface of a rotating platen, which is pressed against the object wiring board for polishing. The whetstone consists of silica, alumina, or cerium dioxide powder. The polishing agent is a solution containing an oxidizer and an organic acid, as well as an inhibitor as needed. This solution may or may not include inorganic abrasive powder. While in polishing, abrasive powder is generated from the whetstone and this makes it more effective to polish the object wiring board. Since such a whetstone is harder substantially than a polishing pad consisting of only resin, the planarization effect is more improved, thereby reducing occurrence of the dishing phenomenon effectively.

However, since the abrasive powder is fixed in the object whetstone, scratches are apt to be created on the surface of the wiring board. To avoid this, therefore, the whetstone should be given characteristics of a higher voiding ratio and easiness to be removed.

According to the present invention, wirings can be inlaid accurately without leaving any portion of the lower metallic layer unpolished and by reducing occurrence of dishing on the upper metallic layer and erosion on the insulating layer, respectively. In particular when the surface of the insulating layer is already planar enough before polishing, the first inhibitor of a satisfactory high concentration is added to the second polishing agent, so that the upper metallic layer is hardly polished. In this case, the polishing force in the second polishing process eliminates the distribution of groove patterns almost completely, thereby both dishing and erosion can be prevented from occurrence all over the predetermined area of the object wiring board. At this time, the depth of dishing and erosion becomes not more than 1/5 of those to appear at a wiring board formed using the related art technique.

DESCRIPTION OF THE PREFERRED EMBODIMENTS

Hereunder, the preferred embodiments of the present invention will be described in detail with reference to the accompanying drawings.

(First Embodiment)

Figure 1A:
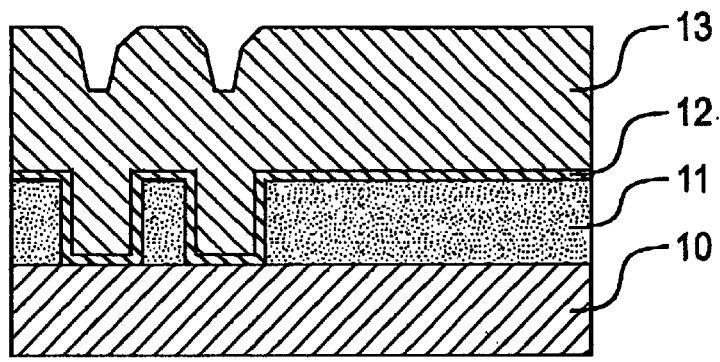
FIGS. 1(a)–1(c) show processes for forming a damascene wiring using a polishing agent that can also be used for both upper and lower metallic layers.
Figure 1B:
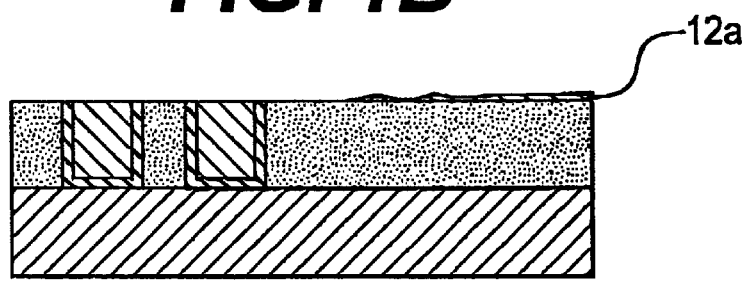

FIG. 1 shows a process for forming a damascene wiring using a polishing agent that can be used for both upper and lower metallic layers. At first, wiring grooves are formed in an insulating layer 11 formed on a wiring board 10 consisting of silicon as shown in FIG. 1(a). The insulating layer consisting of silicon dioxide is 0.5 microns in thickness. Then, a titanium nitride layer of 50 nm in thickness is formed on the insulating layer 11 using a well-known reactive sputtering method so as to function as a lower metallic layer 12. After that, a copper layer of 800 nm in thickness is formed on the lower metallic layer 12 using the sputtering method so as to function as an upper metallic layer 13, then inlaid in those wiring grooves through a thermal treatment. Then, the upper metallic layer 14 is polished using the first polishing agent as shown in FIG. 1(b).

The polishing agent is obtained by adding 0.01 wt % of BTA to a mixture of QCTT10101 (a product of RODEL Inc.) and a 30% hydrogen peroxide solution at a rate of 7:3.

This polishing solution contains a few % of alumina abrasive powder, as well as an organic acids used as an etching agents for copper or copper oxides. The polishing pad is a grid-grooved hard polishing pad consisting of foamed polyurethane. The polishing characteristics are as follows; polishing pressure . . . 200 g/cm$^2$, polishing rate . . . about 100 nm/min at a relative velocity (referred as linear velocity) between the wiring board 10 center and the platen (not illustrated) of 40 m/min. If no BTA is added to the polishing agent, the polishing rate was about 160 nm/min. Consequently, the polishing rate was slowed down to about 60% when the BTA was added, although the reduction was within a predetermined allowable range. The etching rate for the upper metallic layer was 5 nm/min in the stirring state. When a faster polishing rate is needed, another well known method is available. The method is to increase the polishing pressure. The polishing was done for 10 min, which was enough to remove both upper and lower metallic layers 13 and 12. However, part 12a of the lower metallic layer was still left unpolished when the entire surface of the insulating layer 11 was observed carefully.

Figure 1C:
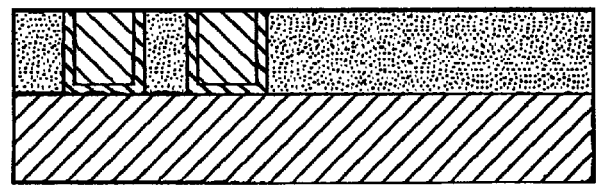

Next, the wiring board 10 was moved onto the second polishing platen (not illustrated) so as to polish the lower metallic layer 12 and the unpolished part 12a as shown in FIG. 1(c). The object polishing agent was obtained by adding 0.1 wt % of BTA to a mixture of QCTT10101 (a product of RODEL Inc.) and a 30% hydrogen peroxide solution at a rate of 7:3. With this addition of BTA, the polishing rate for the copper based alloy was slowed down up to 20 nm/min under the same conditions as those described above. On the other hand, the polishing rate for titanium nitride was about 50 nm/min, which was almost the same as that before the BTA was added. When such the second polishing agent was used to polish the wiring board 10, almost all the upper metallic layer 13 in the grooves were left unpolished, while the unpolished part 12a of the lower metallic layer other than that in the grooves was removed stably. An increase of the dishing to appear on the upper metallic layer was only about 30 nm even when 100% excess polishing was done for the lower metallic layer. It was thus confirmed that the reduction of the cross section of the inlaid wiring was negligibly small. The polishing selectivity for the upper metallic layer to the lower metallic layer could be adjusted within 0.5 to 3 by changing the concentration of the BTA added to the second polishing agency.

(Second Embodiment)

In FIG. 1, the lower metallic layer 12 consisting of tungsten was formed with a thickness of 50 nm on the wiring board 10, which is equivalent to that in the first embodiment. The sputtering method was used for forming the film. Then, the upper metallic layer 13 was polished, thereby removing the lower metallic layer 12 almost completely as shown in FIG. 1(b). The first polishing agent was used for the polishing under the same conditions as those in the first embodiment.

Next, the wiring board 10 was moved onto the second polishing platen (not illustrated) so as to polish the lower metallic layer 12 and its unpolished part 12a as shown in FIG. 1(c). The second polishing agent used at this time was obtained by mixing a solution containing a malonic acid and 0.1 wt % of BTA with a 30% hydrogen peroxide solution at a rate of 15:1. A surfactant was also added to the mixed solution as needed. The polishing agent contained no fixed abrasive powder. This polishing agent could polish the lower metallic layer 12 at a rate of about 30 nm/min. The etching rate was 2.5/min to 3 nm/min. The insulating layer 11 was polished at a rate of 1 nm/min in the second polishing process. The planarity of the surface of the insulating layer 11 was hardly degraded even with the excess polishing performed for 10 min. In this embodiment, no abrasive powder of the first polishing agent stuck on the surface of the wiring board 10 was recognized after the second polishing was finished. Therefore, the foreign matters was reduced effectively to not more than ⅕ in number compared to the case where the second polishing agent including abrasive powder was used.

(Third Embodiment)

The wiring board 11 and the polishing agent used in this embodiment were equivalent to those shown in the first embodiment. In this embodiment, however, the same polishing platen was used for both lower and upper metallic layers 12 and 13 commonly. The treatments up to the end of the polishing of the upper metallic layer 13 shown in FIG. 1(b) were the same as those in the first embodiment. In this embodiment, while the wiring board 11 remained at the same position, the first polishing agent was replaced with the second polishing agent, so as to polish titanium nitride of the lower metallic layer 13 as shown in FIG. 1(c). During this polishing, the composition of the second polishing agent was the same as that of the first polishing agent, except for the concentration of BTA, which was an inhibitor. The lower metallic layer was thus polished stably just like in the first embodiment with no harmful special problem even when both agents were mixed.

If polishing of the next wiring board was started using the first polishing agent, a problem arose; the polishing rate for the upper metallic layer became unstable due to the high concentration inhibitor contained in the second polishing agent and still stuck on the polishing platen. To avoid this problem, therefore, a conditioning treatment (polishing away the surface of the polishing pad to obtain the predetermined state) was performed using a diamond whetstone by pouring a solution on the polishing platen, thereby removing the residual alumina abrasive powder from the surface of the polishing pad before the polishing of the next wiring board 10. The solution used for the treatment is the first polishing agent or the first polishing agent in which BTA of a concentration equal to or not more than that contained in the first polishing agent. The treatment time was at least not less than 10 sec, preferably more than 20 sec. When the polishing of the upper metallic layer was started for the next wiring board after that, unnecessary portions of the upper or lower metallic layer was polished away stably, thereby the inlaid wiring was formed favorably without any influence by the previous polishing of the wiring board 10.

(Fourth Embodiment)

The wiring board 11 used in this embodiment was the same as that in the second embodiment. Concretely, a tungsten film of 50 nm in thickness was used as the lower metallic layer 12. The first polishing agent used in this embodiment was also the same as that in the first embodiment. The second polishing agent was a mixed solution obtained by mixing SS-W2000 (CABOT Inc.) containing 1 wt % of BTA (protection layer forming agent) with a 30% concentration hydrogen peroxide solution at a volumetric rate of 15:1. The polishing rate for copper, when the first polishing agent was used, was about 100 nm/min under the same conditions as those in the first embodiment. After the lower metallic layer 12 except for the grooves was exposed as shown in FIG. 1(b), the first polishing agent was replaced with the second one to continue the polishing. Although the polishing rate for the upper metallic layer 14 using the second polishing agent was 20 nm/min, the polishing rate for the lower metallic layer 12 was about 150 nm/min and the etching rate in stirring state for the lower metallic layer 12 was not more than 10 nm/min. Although the polishing time for the lower metallic layer 12, when the second polishing agent was used, was not more than one min, excess polishing was performed for two min so as to polish the layer 12 completely without leaving any part unpolished on the nominal surface. Even with this excess polishing, the upper metallic layer 13 was polished away only by about 15 nm, thereby the inlaid wiring was formed accurately enough.

(Fifth Embodiment)

FIG. 2 shows processes for forming a damascene wiring using a polishing agent that hardly polishes the lower metallic layer. As shown in FIG. 2(a), wiring grooves were formed on an insulating layer 21 consisting of silicon dioxide and having a thickness of 0.5 microns. The insulating layer 21 was formed on a wiring board 20. Then, the lower metallic layer 22 consisting of tantalum nitride and having a thickness of 50 nano-meters was formed on the insulating layer 21 using the well-known sputtering method. After that, the upper metallic layer 23 consisting of a copper of 800 nm in thickness was formed using a sputtering method, then inlaid in those grooves through a thermal treatment. Then, the upper metallic layer 23 was polished as shown in FIG. 2(b), thereby exposing the lower metallic layer 22 except for the portions in the grooves. The polishing agent used for the upper metallic layer contained 0.2 wt % of BTA to function as an inhibitor and 0.15 wt % of citric acid as an organic acid. The polishing rate for the upper metallic layer 23 was about 100 nm/min and the stirring etching rate for the upper metallic layer was 8 nm/min. No inorganic fixed abrasive powder was added to the polishing agent. In this first polishing process, the lower metallic layer 22 was hardly polished. Consequently, the layer 22 was left unpolished all over the wiring board 20.

Figure 2A:
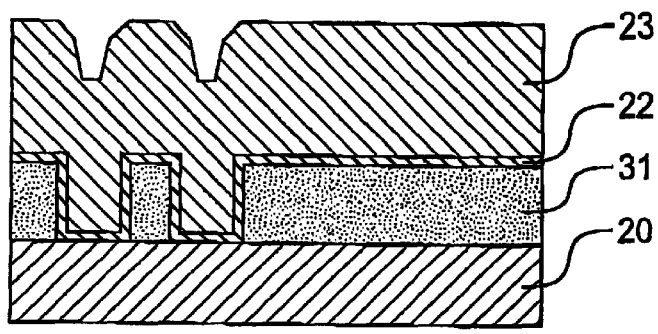
FIGS. 2(a)–2(d) show processes for forming a damascene wiring using a polishing agent that hardly polishes the lower metallic layer.
Figure 2B:
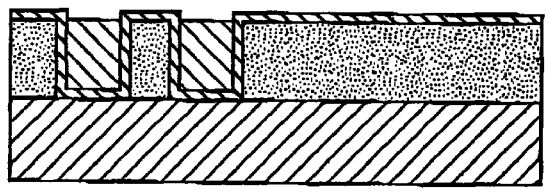
Figure 2C:
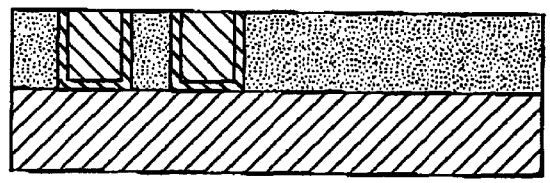
Figure 2D:
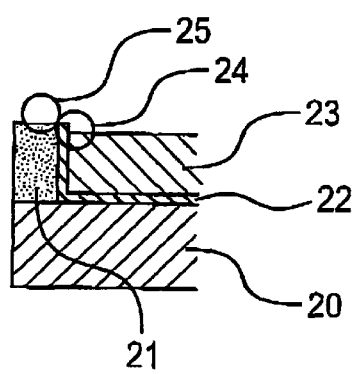
Figure 3A:
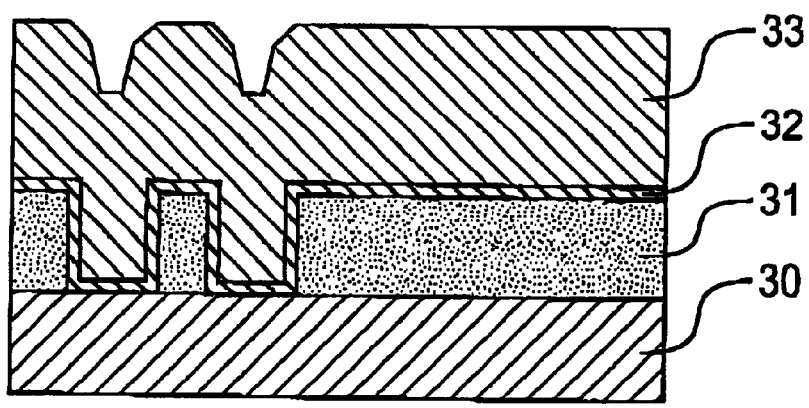
FIGS. 3(a)–3(e) show problems to appear in the conventional damascene wiring forming processes.
Figure 3B:
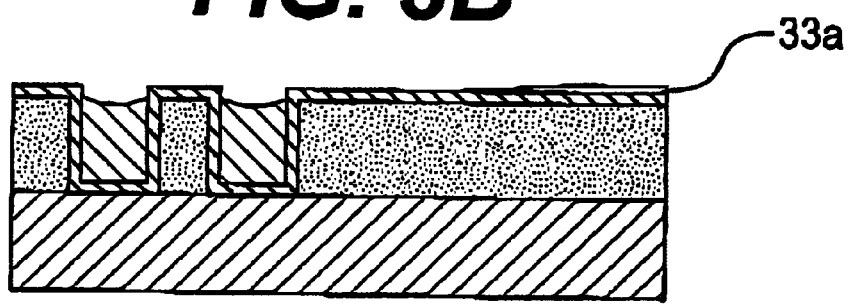
Figure 3C:
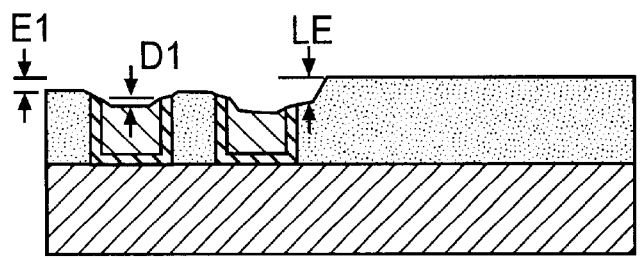
Figure 3D:
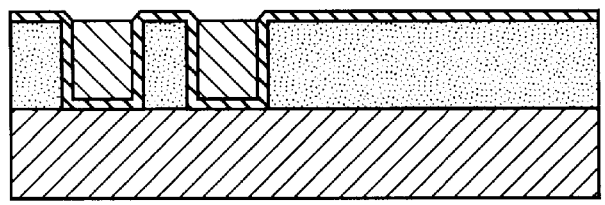
Figure 3E:
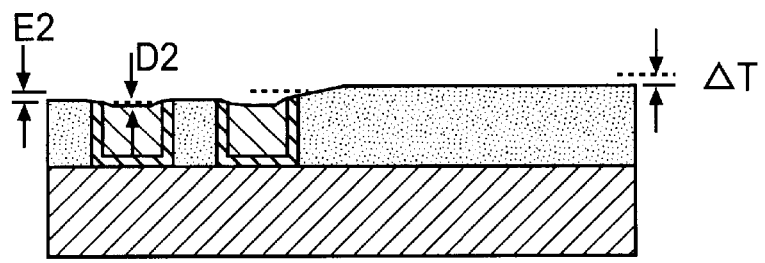
Figure 4A:
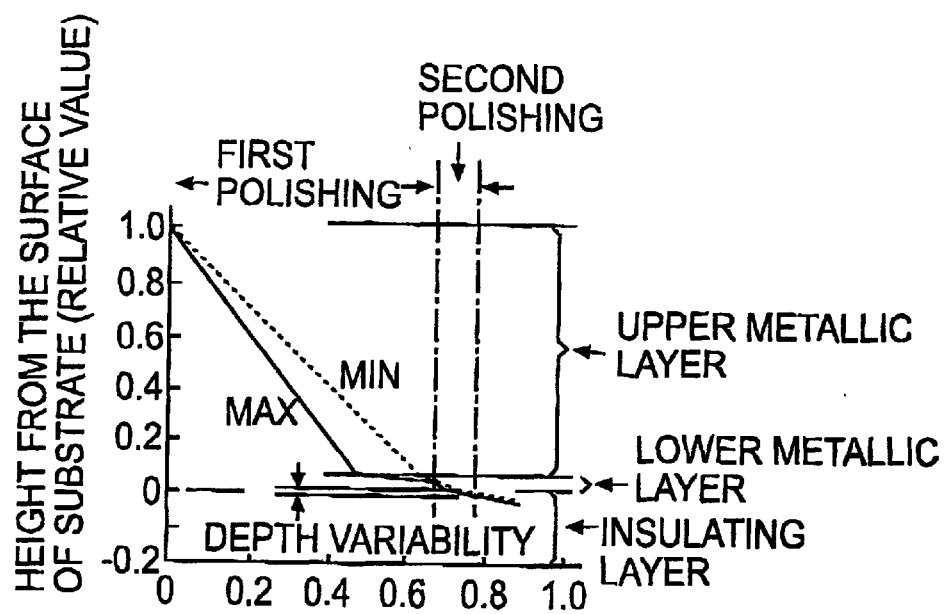
FIGS. 4(a) and 4(b) show changes of the surface of the wiring board in the depth direction with time when the polishing method of the present invention is used.
Figure 4B:
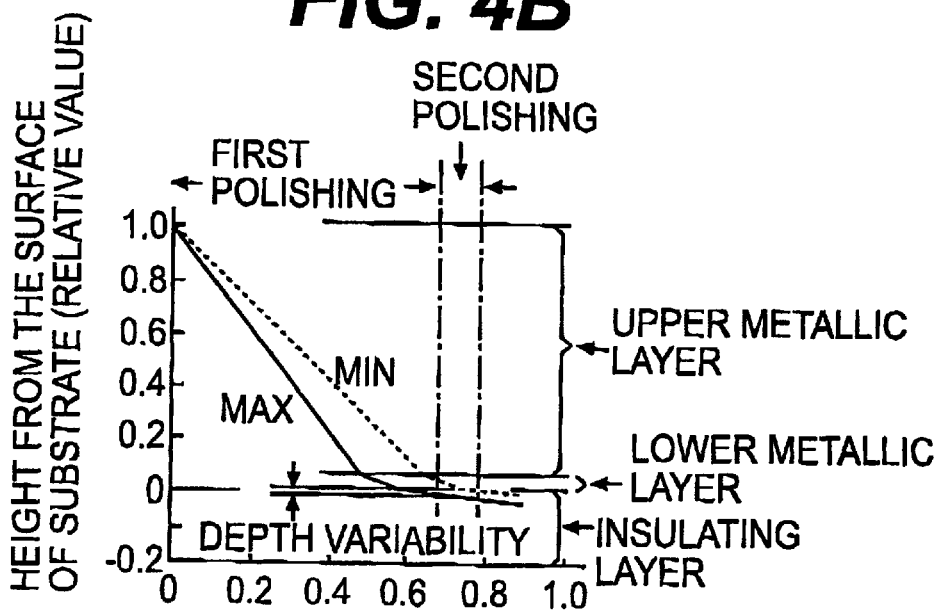

Then, the wiring board was moved onto the second polishing platen (not illustrated) so as to polish the lower metallic layer 22 as shown in FIG. 2(c). The polishing agent used at this time was a mixture obtained by mixing a polishing agent containing 3 wt % of alumina abrasive powder and an organic acid consisting of phthalic acid, with a 30% hydrogen peroxide solution, then adding 1 wt % of BTA to the mixture. With this addition of BTA, the polishing rate for the copper based alloy was reduced up to not more than 5 nm/min under the same conditions as those in the first embodiment. Although the polishing rate for the lower metallic layer 23 was as low as about 20 nm/min, the polishing process including the excess one was carried out for four min. The upper metallic layer 23 in the grooves were hardly polished, while the tantalum layer (lower metallic layer) of 50 nm in thickness other than the portions in those grooves was removed stably. At this time, the polishing rate for the insulating layer was not more than 3 nm/min.

If the reactive sputtering method is used for forming a tantalum film to function as the lower metallic layer 22 while nitrogen is added to the film, a tantalum nitride film is formed. The polishing rate for this film was about 30 nm/min, which made the polishing a little easier.

(Sixth Embodiment)

In FIG. 2, the wiring board 20 used in this embodiment was the same as that in the second embodiment. The first polishing agent used for this wiring board 20 contained 0.1 wt % of BTA to function as the first inhibitor and 0.05 wt % of ammonium polyacrylic acid to function as the second inhibitor, and 0.05 wt % of malic acid to function as the organic acid. The polishing rate for the upper metallic layer 23 was about 150 nm/min and the stirring etching rate for the upper metallic layer was 5 nm/min. No inorganic fixed abrasive powder was contained in the polishing agent. This polishing of the upper metallic layer 23 exposed the lower metallic layer 22 except for the portions in those grooves as shown in FIG. 2(b). Although about 50% excess polishing was carried out at this time, the lower metallic layer 22 was still left unpolished and each depression of the upper metallic layer 23 was suppressed to not more than a few nanometers.

Next, the wiring board 20 was moved onto the second polishing platen (not illustrated) so as to polish the lower metallic layer 22 as shown in FIG. 2(c). The second polishing agent used in this embodiment was a mixed solution obtained by mixing a solution containing malonic acid and 0.1 wt % of BTA to function as the second polishing agent with 30% hydrogen peroxide solution at a rate of 15:1. A surfactant was also added to the mixed solution as needed. No abrasive powder was contained in the polishing agent. This polishing agent could polish the lower metallic layer 22 at a rate of about 30 nm/min. The etching rate at this time was 2.5 to 3 nm/min. The polishing rate for the insulating layer 21 in the second polishing process was not more than 1 nm/min and the surface planarity of the insulating layer 21 was hardly degraded even with 10 min excess polishing. In addition, in this embodiment, no abrasive powder was contained in the polishing agent used in both first and second polishing processes. The number of residual foreign matters after the polishing was therefore reduced to not more than 1/10 of that when the polishing agent contains abrasive powder.

(Seventh Embodiment)

See FIG. 1 again. The wiring board used in this embodiment was the same as that used in the first embodiment. The same process steps as those in the first embodiment were used to form layers up to the upper metallic one 13. Instead of a polishing pad, a resin bonded whetstone (not illustrated) using silica abrasive powder was placed on the rotating platen of the polishing apparatus. The silica powder was selected so that 80% of the power became 0.4 microns ±0.2 microns in particle size. A porous fragile structure was employed for the whetstone. Novolac type resin was used to fix the abrasive powder. The voiding ratio of the whetstone was about 30%. Then, the wiring board 10 was pressed against the resin bonded whetstone as shown in FIG. 1(b) for polishing the object layer. Although the polishing conditions were almost the same as those in the above embodiments, the polishing pressure was reduced to 140 $g/cm^2$ so as to avoid scratches to occur during the polishing. The first polishing agent was a solution including citric acid as the organic acid and 0.2 wt % of BTA as the inhibitor, respectively. Consequently, the upper metallic layer 13 was removed at a polishing rate almost equal to that of the conventional polishing agent containing inorganic fixed abrasive powder. The polishing rate was about 120 nm/min. The etching rate was about 3 nm/min. The polishing time including the excessive polishing of about 10% was 7 min 30 sec. Since the whetstone was hard, the upper metallic layer 13 was removed even in a 1 mm square area through this polishing. However, part 12a of the lower metallic layer was left unpolished in a significant number of areas on the wiring board 10.

After that, the BTA in the first polishing agent was increased to 0.5 wt %, thereby obtaining the second polishing agent used on the same whetstone. With such a concentration of the BTA in the polishing agent, the polishing rate for the upper metallic layer 13 was not more than 10 nm/min. On the other hand, the polishing rate for the lower metallic layer 12 was about 50 nm/min and the etching rate for the same was not more than 2 nm/min. The 2.5-minute polishing left no unpolished part on the lower metallic layer 12 even in no-pattern areas. The method that uses this whetstone is characterized by that inlaid wirings can be formed even in wide grooves with less dishing. Under the same polishing force, the dishing was suppressed almost equally even for patterns having a width of three times larger than the case using ordinary polishing pad.

Preparing for polishing another wiring board just after that, conditioning was carried out by pouring pure water on the whetstone, thereby lowering the concentration of the residual BTA on the surface of the whetstone.

(Eighth Embodiment)

Hereunder, description will be made for how to form a two-level copper wiring pattern on a wiring board provided with devices thereon with reference to FIGS. 6 through 11. In this embodiment, the devices formed on the wiring board are transistors. If a dynamic random access memory is formed as such a device, a process for forming capacitors is just added to the processes in the above embodiment. After an electrode is led out from each device, the processes are equivalent substantially to those in the above embodiment.

Figure 6:
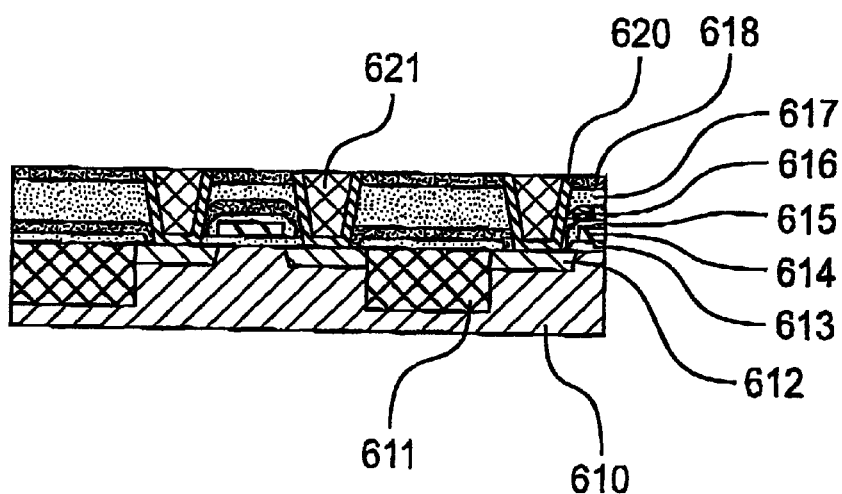
FIG. 6 shows an example of how to form a two-level copper wiring on the wiring board on which devices are formed.

At first, as shown in FIG. 6, an inlaid insulating layer 611 was formed on the surface of a wiring board 610 consisting of a silicon substrate including p-type impurities. The insulating layer 611 was used to separate a device electrically from others. This surface was planarized through polishing using an alkaline polishing agent containing silica abrasive powder and ammonia. Then, an n-type impurity diffusion layer 612 was formed through ion implantation, thermal treatment, etc. Then, a gate insulating film 613 was formed using the thermal oxidizing method, etc. After that, each gate 614 was formed so as to consist of polycrystal silicon and a multi-layered film consisting of polycrystal silicon and a refractory metal. On the surface was then covered by a device passivation layer 615 consisting of silicon dioxide or a silicon dioxide film to which phosphorus is added, as well as an anti-pollution film 616 consisting of a silicon nitride film for preventing the entry of polluted substances from external. In addition, a planarization layer 617 was formed with a thickness of about 1.5 microns using the plasma CVD method that uses TEOS (tetraethoxysilane) as a raw material. The planarization layer 617 is referred as p-TEOS. Then, the above insulating film was polished away by about 0.8 microns, thereby planarizing the surface. In addition, the surface was covered by the second passivation layer 618 consisting of silicon nitride and used for preventing the diffusion of copper thereon. After that, each contact hole 619 for connecting a device in predetermined position was formed. A multi-layered film 620 consisting of titanium and titanium nitride, as well as a tungsten layer 621 were formed so as to be used for both adhering and pollution preventing. The entire film except for the holes was then removed through polishing, thereby forming so-called plugs.

Both titanium and titanium nitride layers were formed using a reactive sputtering method and a plasma CVD method. The tungsten layer can also be formed using a sputtering method and a CVD method. The contact hole was not more than about 0.25 microns in diameter and 0.8 to 0.9 microns in depth. When devices of the above-described dynamic random access memory, etc. are to be formed, the contact holes will become deeper, at least one micron or more in cases. The thickness of the multi-layer 620 was decided to about 50 nm at the nominal surface of the second passivation layer 618. The thickness of the tungsten was set to about 0.6 microns. This was because each contact hole was inlaid deeply enough so as to improve the planarity of the film surface and making it easier to polish the tungsten layer. Any polishing agent available on the market may be used for polishing these tungsten and laminated layers. The second polishing agent of the present invention may also be used for the polishing.

Figure 5:
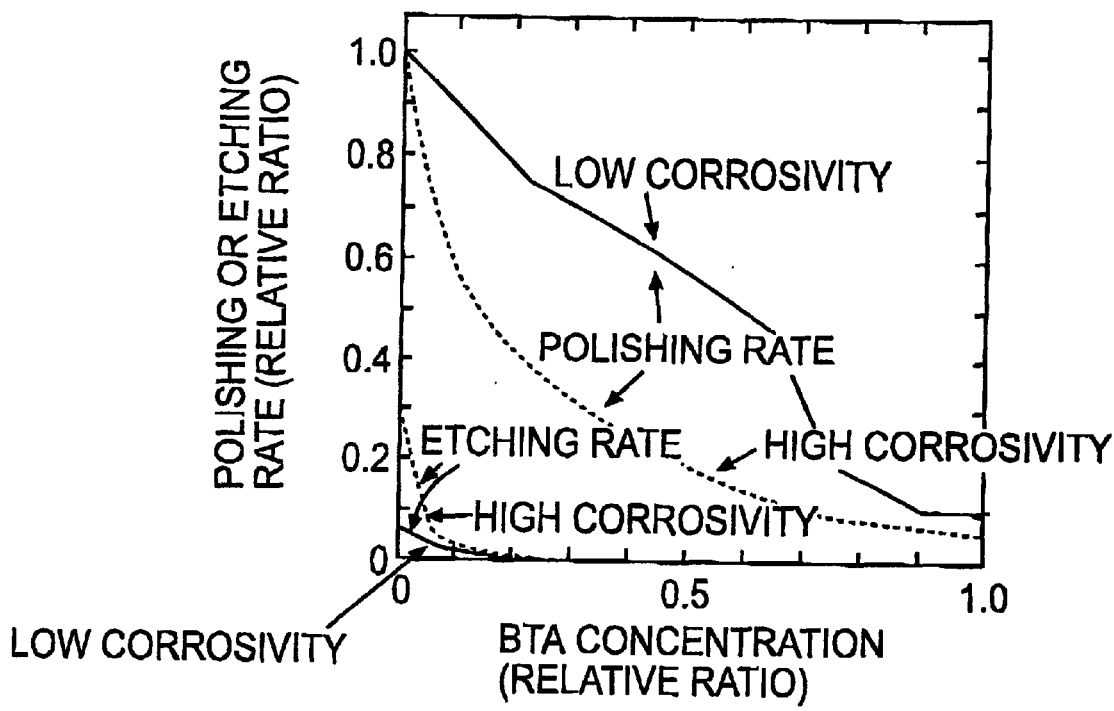
FIG. 5 shows an example of the polishing agent of the present invention.
Figure 7:
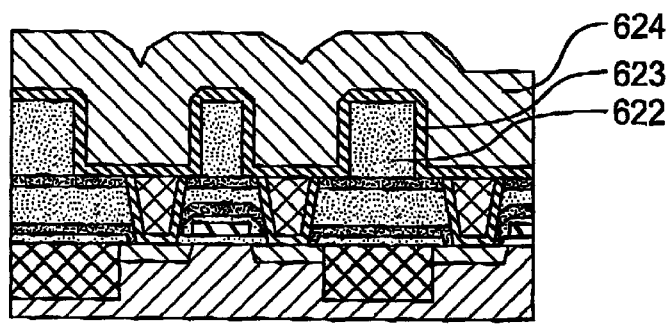
FIG. 7 shows an example of how to form a two-level copper wiring on the wiring board on which devices are formed.
Figure 8:
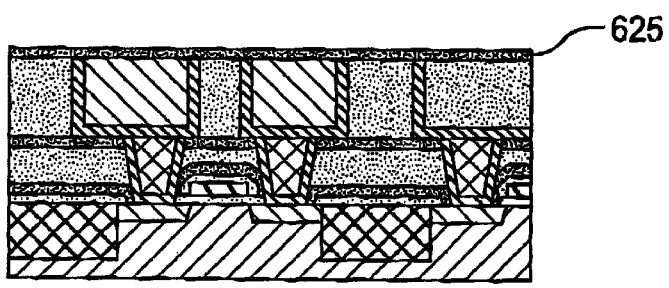
FIG. 8 shows an example of how to form a two-level copper wiring on the wiring board on which devices are formed.
Figure 9:
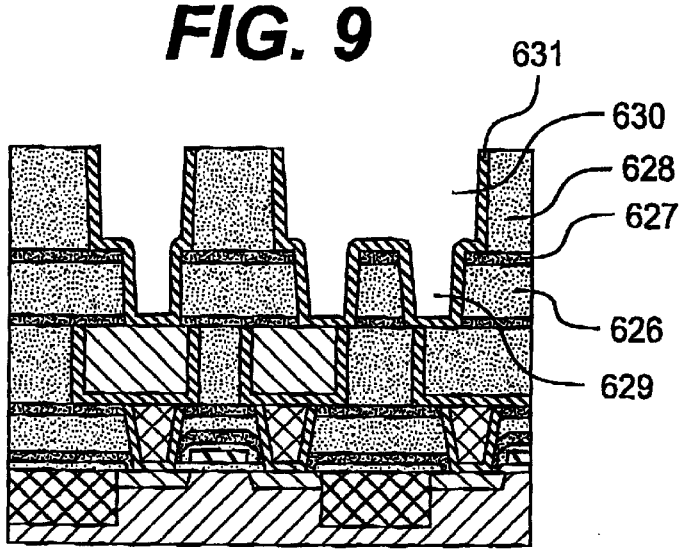
FIG. 9 shows an example of how to form a two-level copper wiring on the wiring board on which devices are formed.

Then, the first interlevel insulating layer (referred as ILD) 622 was formed as shown in FIG. 7, followed by forming of the wiring grooves. After that, the first lower metallic layer 623 consisting of titanium nitride and having a thickness of 50 nm, as well as a copper film used as the first upper metallic layer 624 were formed. The first ILD 622 was 0.5 microns in thickness. Although a well-known reactive dry etching technique was used for forming the wiring grooves, the second passivation layer 618 was also used as an etching stopper. Since the etching rate for silicon nitride was about ⅕ of that for silicon dioxide, the thickness was about 10 nm. A copper film used as the first upper metallic layer was formed with a thickness of 0.7 microns using the sputtering method. A thermal treatment was then carried out at about 450° so as to flow the copper and inlaid in the grooves. Then, the first upper metallic layer 624 and the first lower metallic layer 623 were polished using the method of the present invention. After the polishing, the second anti-pollution layer 625 consisting of silicon nitride was formed on the surfaces of the polished metallic layers 624 and 623 using the plasma CVD method. The second multi-pollution layer 625 was 20 nm in thickness. The first polishing agent used for the above polishing contained an organic acid, an inhibitor, and an oxidizer. The agent did not include inorganic abrasive powder. In the first polishing process, the polishing pressure was increased up to 300 g/cm², thereby increasing the polishing rateup to about 200 nm/min. The polishing rate for the first lower metallic layer 623 was not more than ¹/₁₀ of that and the polishing was stopped on the surface effectively. In the second polishing process, the low-corrosive polishing agent was used that contained alumina abrasive powder, and the low BTA concentration as shown in FIG. 5. When the relative concentration of the BTA was within 0.1 to 0.2 and the polishing pressure was 200 g/cm², the polishing rate for the first lower metallic layer was about 70 nm/min. This polishing agent had a faster polishing rate for copper, but the etching rate was low enough. And, if various devices are to be formed on the surface of the object wiring board 610 just like in this embodiment, large and complicated height differences will be generated on the surface, then the surface of the first ILD 622 cannot be planarized satisfactorily even through polishing of the planarization layer 617. Consequently, shallow and wide depressions of about 5 nm in depth and 5 microns in width, which is equal to a device width, are left on the surface in cases. If the first polishing agent has excellent characteristics and almost no dishing appears, unpolished portions of the first upper metallic layer 624 will be left in those shallow depressions in cases. This is why this embodiment uses the second polishing agent, which contains the BTA whose concentration is low and which can take comparatively a larger polishing rate for the first upper metallic layer in order to prevent short-circuits in the wiring to be caused by such an unpolished portion. After that, a p-TEOS film was formed with a thickness of 0.7 microns, which was used as the second ILD 626 and the surface of the ILD was polished away up to a depth of 0.2 micron using the above method so as to be planarized. This planarization is intended to eliminate the height differences generated in the polishing processes for the underlying level of the first upper metallic layer, etc. Then, a silicon nitride film was formed with a thickness of 0.2 micron and a p-TEOS film was formed with a thickness of 0.7 micron using the plasma CVD method, respectively. The silicon nitride film was used as the third anti-pollution layer 627 and the p-TEOS film was used as third ILD 628. Then, the first via holes 629 and the second level wiring grooves 630 were formed using a well-known photo-lithography technique and the reactive dry etching technique, thereby exposing the surface of the first upper metallic layer 624. If such a two-level groove pattern is to be formed, the silicon nitride film 627 will function as an etching stopper. After that, in the two-level grooves formed such way was formed a titanium nitride film 631 with a thickness of 50 nm as the second lower metallic layer 631 as shown in FIGS. 8 and 9 using the plasma CVD method.

Figure 10:
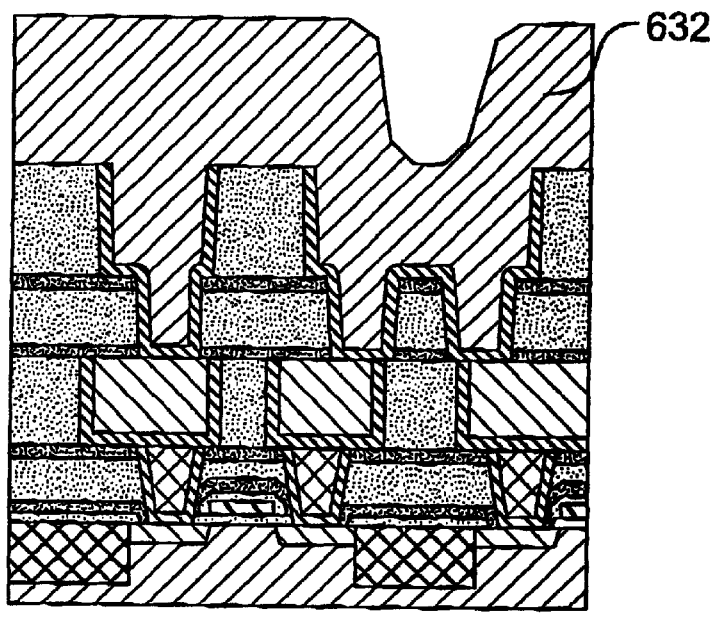
FIG. 10 shows an example of how to form a two-level copper wiring on the wiring board on which devices are formed.
Figure 11:
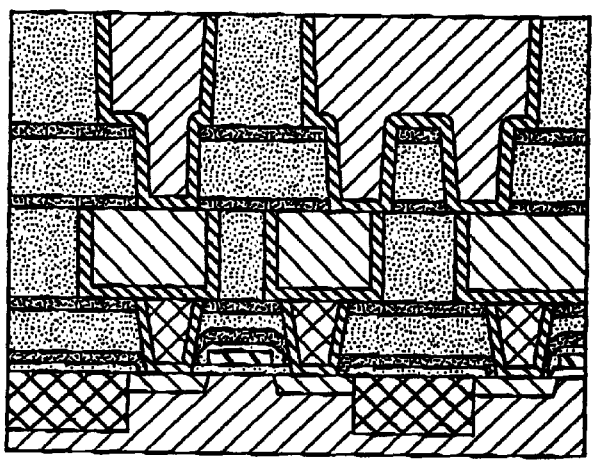
FIG. 11 shows an example of how to form a two-level copper wiring on the wiring board on which devices are formed.

In addition, the second upper metallic layer 632 was formed with a thickness of 1.2 microns as shown in FIG. 10 using the sputtering method. The layer 632 was then inlaid in the grooves through a thermal treatment performed at 450°. After that, both second upper and lower metallic layers 632 and 631 were polished, thereby forming the two-leveled wiring pattern as shown in FIG. 11. Since the second upper metallic layer 632 was thick, the layer 632 was polished using a low-corrosive polishing agent containing a low concentration inhibitor, that is containing alumina abrasive powder shown in FIG. 5, and low concentration BTA. The polishing rate was about 200 nm/min and the polishing time including the excess polishing was eight min. The second polishing agent was a low-corrosive one containing high concentration BTA. The relative ratio of the BTA to the polishing agent was about 0.7. The polishing rate for the lower metallic layer 631 was faster than that for the upper metallic layer. When polishing was done in two steps as described above, therefore, multi-layer wirings were formed with a high yield while the surface of each of the insulating layers and metallic layers was planarized satisfactorily.

(Ninth Embodiment)

Figure 12A:
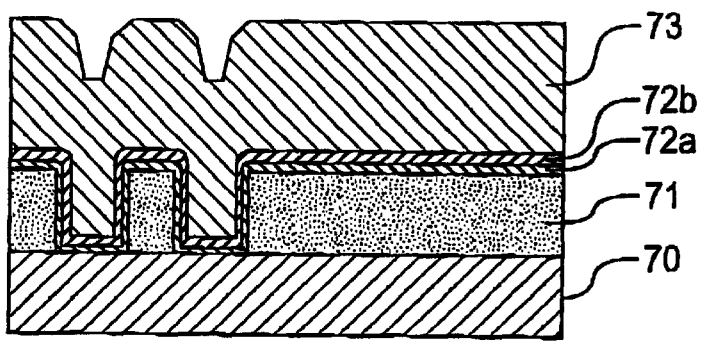
FIGS. 12(a)–12(c) show the lower metallic layer consisting of two-layered laminated film.
Figure 12B:
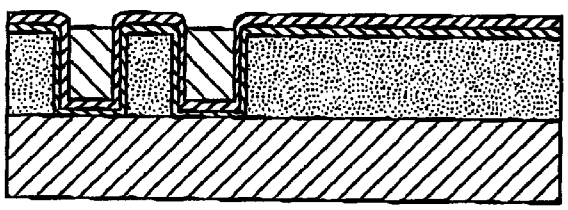
Figure 12C:
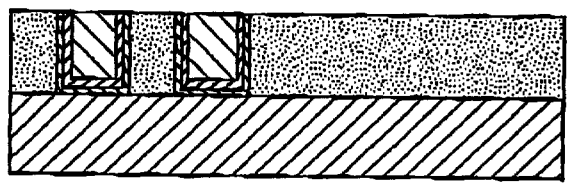

Hereunder, description will be made for how to form wirings in three layers consisting of an upper metallic layer and two lower metallic layers with reference to FIG. 12. As shown in FIG. 12(a), at first, a p-TEOS film was formed with a thickness of 0.5 micron on a wiring board 70 consisting of silicon. A predetermined insulating layer (not illustrated) is already formed on the wiring board 720. The p-TEOS film functions as an insulating layer 71. Then, grooves were formed on the p-TEOS film. After that, a titanium film was formed on the p-TEOS film (insulating film 71) with a thickness of 3 nm. The titanium film functions as the lower metallic layer 72a for connection. Then, a titanium nitride film was formed on the lower metallic layer 72a with a thickness of 40 nm using the reactive sputtering method. The titanium nitride film functions as the lower metallic barrier layer 72b barrier using the reactive sputtering method. Then, a copper film was formed on the lower metallic layer 72b with a thickness of 0.8 microns so as to function as the upper metallic layer 73. After that, the upper metallic layer 73 was polished, thereby exposing the lower metallic layer 72b as shown in FIG. 12(b). The first polishing agent containing no abrasive powder was used for this treatment. The lower metallic layers 72a and 72b were then polished using a polishing agent obtained by adding BTA carboxylic acid of relative concentration of 0.8 to the object polishing agent, which contains alumina abrasive powder, an organic acid, and a hydrogen peroxide solution. The BTA carboxylic acid is used as an inhibitor shown in FIG. 5.

The polishing rate for the upper metallic layer 73 was reduced to not more than 20% of that when no BTA carboxylic acid was added to the polishing agent. Although this polishing agent could polish the lower metallic barrier layer 72b at a rate of about 80 nm/min, the polishing rate for the lower metallic layer 72a for connection was as low as about 20 nm/min. Since the lower metallic layer 72a was 3 nm in thickness, however, the average polishing rate, when both lower metallic layers 72a and 72b were polished, was about 70 nm/min. The polishing rate was high satisfactorily. The polishing rate for the insulating layer 71 was about 5 nm/min.

In the first to ninth embodiments, the sputtering method was used to form the upper metallic layer, then inlaid in the grooves through a thermal treatment respectively. In this case, since the inlaying characteristics were not satisfactory, each upper metallic layer had to be formed with a thickness of 0.8 microns for the groove of 0.5 micron in depth. Consequently, the 0.8-micron metallic layer was polished and an excess polishing process was needed by not less than 10% for the metallic layer. In addition, if the aspect ratio of the groove was over 3, an insufficient inlaying problem arose. On the other hand, an examination was made for a wiring board in which the object wiring pattern was inlaid through electroplating using a solution consisting mainly of copper sulfate. The inlaying characteristics were thus improved significantly and a 0.6-micron thick film was enough to inlay the object wiring in a groove of 0.5 micron in depth. A thermal treatment was applied to the film at 350° for 30 min in nitrogen before the polishing in order to improve the adhesive properties. When the present invention was applied to such a wiring board, almost no difference was recognized between the films formed using the sputtering method and this electroplating method, although the polishing rate was increased by 5 to 10% more than that for films formed using the sputtering method. The planarization of the film was satisfactory.

According to the present invention, the sizes of depressions including both dishing and erosion were reduced to about ½ of those of the conventional method. If one or both of the first and second polishing agents contain no fixed abrasive powder, the effect is especially remarkable; the depth of the depressions is reduced to not more than ⅓.

What is claimed is:

1. A method for manufacturing a semiconductor devices comprising the steps of:

forming at least an insulating film on a substrate;

forming at least a via hole in said insulating film;

forming a first conductor film extended from said via hole to a surface of said insulating film;

forming a second conductor film on said first conductor film extended from said via hole to the surface of said insulating film;

polishing said second conductor film; and polishing said first conductor film at a polishing rate not less than five times the polishing rate for said insulating film.

2. A method for manufacturing a semiconductor device in accordance with claim 1, wherein said second conductor film is a copper film or a copper based alloy film.

3. A method for manufacturing a semiconductor device in accordance with claim 1, wherein said first conductor film is a film of a material selected from the group consisting of titanium, tantalum, and tungsten atoms.

4. A method for manufacturing a semiconductor device in accordance with claim 1, wherein the step for polishing said first conductor film uses an inhibitor added a polishing agent in which an inhibitor for said second conductor film is contained.

5. A method for manufacturing a semiconductor device in accordance with claim 4, wherein said inhibitor is a film of a material selected from the group consisting of BTA (Bensotriazole), BTA carboxylic acid, dodecanethiol, Triazole, Tritiazole, or derivatives of those substances.

6. A method for manufacturing a semiconductor device in accordance with claim 4, wherein the step for polishing said first conductor film uses a polishing agent obtained by adding second inhibitor, which contains said second inhibitor of a material selected from the group consisting of Poly-acrylic acid and Poly-methacrylic acid, or ammonium acid salts of those substances, or a-compound of those substances, or ethlenediaminetetraacetic acid to said first inhibitor.

7. A method for manufacturing a semiconductor device in accordance with claim 4, wherein the step for polishing said first conductor film uses a polishing agent containing a first amount of said inhibitor;

the step for polishing said second conductor film uses a polishing agent containing a second amount of said inhibitor; and said first amount is more than said second amount.

8. A method for manufacturing a semiconductor device in accordance with claim 7, wherein said first amount is 0.01 wt % more than said second amount.

9. A method for manufacturing a semiconductor device in accordance with claim 4, wherein the step for polishing said second conductor film uses said inhibitor at a concentration not less than 0.01 wt % and not more than 0.05 wt %; and the step for polishing said first conductor film uses said inhibitor at a concentration not less than 0.04 wt % and not more than 1 wt %.

10. A method for manufacturing a semiconductor device in accordance with claim 1, wherein the step for polishing said second conductor film uses a polishing agent to which an inhibitor is added;

the concentration of said inhibitor is decided so that the polishing rate becomes not less than 40% and not more than 95% of that for said second conductor film when said inhibitor is not added.

11. A method for manufacturing a semiconductor device in accordance with claim 1, wherein the step for polishing said first conductor film uses said inhibitor at a concentration set so as to make the polishing rate for said first conductor film become not more than 30% of that for said first conductor film when said inhibitor is not used.

12. A method for manufacturing a semiconductor device, comprising steps of:

forming an insulating film on a substrate;

forming a via hole in said insulating film;

forming a first conductor film extended from said via hole to a surface of said insulating film;

forming a second conductor film on said first conductor film extended from said via hole to the surface of said insulating film;

polishing said second conductor film; and polishing said first conductor film at a polishing rate not less than seven times the polishing rate of said insulating film.

13. A method for manufacturing a semiconductor device, comprising steps of:

forming an insulating film on a substrate;

forming a via hole in said insulating film;

forming a first conductor film extended from said via hole to a surface of said insulating film;

forming a second conductor film on said first conductor film extended from said via hole to the surface of said insulating film; polishing said second conductor film and polishing said first conductor film at a polishing rate not less than 10 times that for said insulating film.

14. A method for manufacturing a semiconductor device, comprising steps of:

forming an insulating film provided with a via hole on a substrate;

forming a first metal film extended from inside to outside of said via hole;

forming a second metal film on said first metal film;

polishing said second metal film; and polishing said first metal film at a polishing rate of more than ten times the etching rate for said second metal film.

15. A method for manufacturing a semiconductor device in accordance with claim 14, wherein the step for polishing said first metal film is carried out in acidic region.

16. A method for manufacturing a semiconductor device in accordance with claim 14, wherein the step for polishing said second metal film is carried out in an acidic region.

17. A method for manufacturing a semiconductor device in accordance with claim 14, wherein the step for forming said first metal film includes forming the first metal film of at least two layers of metals.

18. A method for manufacturing a semiconductor device, comprising steps of:

forming an insulating film provided with a via hole on a substrate;

forming a first metal film extended from inside to outside of said via hole;

forming a second metal film on said first metal film;

polishing said second metal film; and polishing said first metal film at a polishing rate of more than ten times the etching rate for said second metal film.

19. A method for manufacturing a semiconductor device, comprising steps of:

forming an insulating film provided with a via hole on a substrate;

forming a first metal film extended from inside to outside of said via hole;

forming a second metal film on said first metal film;

polishing said second metal film; and polishing said first metal film at a polishing rate of more than fifteen times the etching rate for said second metal film.

20. A method for manufacturing a semiconductor device in accordance with claim 19, wherein said substrate is 150 mm or more in diameter.

21. A method for manufacturing a semiconductor device, comprising steps of;

forming an insulating film provided with a via hole on a substrate;

forming a first metal film extended from inside to outside of said via hole;

forming a second metal film on said first metal film;

polishing said second metal film;

polishing said second metal film by a polishing slurry at a polishing rate of at least five times larger than the etching rate for said second metal film, and polishing said first metal film.

22. A method for manufacturing a semiconductor device in accordance with claim 21, wherein said first metal film is polished at a polishing rate of not less than five times the etching rate for said second metal film.

23. A method for manufacturing a semiconductor device, comprising the steps of:
forming grooves in an insulating film;
forming a first conductor film on said grooves-formed insulating film so as to be extended from inside to outside each of said grooves;
forming a second conductor film on said first conductor film;
polishing both of said first and second conductor films using first polishing agent; and
polishing unpolished portions of said second conductor film at a polishing rate of not less than 5 times that for said insulating film using second polishing agent.

24. A method for manufacturing a semiconductor device in accordance with claim 23, wherein
said first polishing agent consists of inorganic solid abrasive powder whose concentration is 0.1 wt % or more.

25. A method for manufacturing a semiconductor device in accordance with claim 23, wherein
at least either said first polishing agent or said second polishing agent contains alumina or silica.

26. A method for manufacturing a semiconductor device in accordance with claim 23, wherein
said first polishing agent contains hydrogen peroxide solution, organic acid, and an inhibitor.

27. A method for manufacturing a semiconductor device in accordance with claim 23, wherein
said first polishing agent contains a first inhibitor of a material selected from the group consisting of BTA (Benzotriazole), BTA derivatives, dodecanethiol, Triazole, Tritriazole, and derivatives or compounds of those substances, and a second inhibitor of a material selected from the group consisting of Poly-acrylic acid, Poly-methacrylic acid, and ammonium acid salts or compounds of those substances, or ethlenediaminetetraacetic acid.

28. A method for manufacturing a semiconductor device in accordance with claim 27, wherein
the concentration of said first inhibitor is not less than 0.01 wt % and not more than 0.05 wt %.

29. A method for manufacturing a semiconductor device in accordance with claim 27, wherein
the concentration of said first inhibitor is set so as to keep a polishing rate of not more than 95% and not less than 40% of that for said second conductor film when said polishing agent does not include said first inhibitor.

30. A method for manufacturing a semiconductor device in accordance with claim 23, wherein
the pH of said second polishing agent is not less than 1 and not more than 6.

31. A method for manufacturing a semiconductor device in accordance with claim 23, wherein
the concentration of the fixed abrasive contained in said second polishing agent is not more than 0.1 wt %.

32. A method for manufacturing a semiconductor device in accordance with claim 23, wherein
said second polishing agent contains an organic acid and an oxidizer.

33. A method for manufacturing a semiconductor device in accordance with claim 32, wherein said organic acid is a material selected from the group consisting of malonic acid, fumaric acid, malic acid, adipic acid, benzoic acid, 4-cyano benzoic acid, phthalic acid, uric acid, oxalic acid, tartaric acid, lactic acid, succinic acid, citric acid or salts obtained from reaction of those acids.

34. A method for manufacturing a semiconductor device, comprising steps of:
forming a first conductor film extended from inside to outside of a groove on a groove-formed insulating film;
forming a second conductor film on said first conductor film;
polishing said second conductive film selectively with respect to said first conductor film; and
polishing said first conductor film at a polishing rate of not less than five times that for said insulating film.

35. A method for manufacturing a semiconductor device, comprising the steps of:
forming an insulating film on a substrate;
forming a via hole in said insulating film;
forming a first conductor film so as to be extended from said via hole onto said insulating film;
forming a second conductor film on said first conductor film;
polishing said second conductor film using a polishing agent containing inorganic abrasive powder whose concentration is not more than 0.1 wt %; and
polishing said first conductor film at a polishing rate of not less than five times the polishing rate for said insulating film.

36. A method for manufacturing a semiconductor device in accordance with claims 35, wherein
the step for polishing said first conductor film uses a polishing agent containing inorganic abrasive not less than 0.1 wt %.

37. A method for manufacturing a semiconductor device in accordance with claim 35, wherein said second polishing agent contains a hydrogen peroxide solution, an organic acid and an inhibitor.

38. A method for manufacturing a semiconductor device in accordance with claim 35, wherein
said polishing agent contains a first inhibitor of a material selected from the group consisting of BTA (Benzotriazole), BTA derivatives, dodecanethiol, Triazole, Tritriazole, and derivatives or compounds obtained from reaction of those acids, and a second inhibitor of the material selected from the group consisting of Poly-acrylic acid, Poly-methacrylic acid, and salts or compounds obtained from reaction of those acids with ammonium, or ethlenediaminetetraacetic acid.

39. A method for manufacturing a semiconductor device in accordance with claim 35, wherein
the step for polishing said first conductor film uses a second polishing agent containing inorganic abrasive whose concentration is 0.1 wt % or under.

40. A method for manufacturing a semiconductor device in accordance with claim 39, wherein
said second polishing agent contains a hydrogen peroxide solution, an organic acid, and an inhibitor.

41. A method for manufacturing a semiconductor device in accordance with claim 39, wherein said second polishing agent contains said first inhibitor of the material selected from the group consisting of BTA (Benzotriazole), BTA derivatives, dodecanethiol Triazole Tritriazole and derivatives or compounds obtained from of those acids, and a second inhibitor of the material selected form the group consisting of Poly-acrylic acid, Poly-methacrylic acid, and salts or compounds obtained from reaction of those acids with ammonium, or ethlenediaminetetraacetic acid.

42. A method for manufacturing a semiconductor device, comprising steps of:

forming a via hole in an insulating film;

forming a first conductor film extended from inside to outside of said via hole on said via-hole-formed insulating film;

forming a second conductor film on said first conductor film;

polishing said second conductor film using a first platen; and polishing said first conductor film inlaid in each of said via hole using a second platen so as to become higher than said second conductor film formed in said via hole.

43. A method for manufacturing a semiconductor device in accordance with claim 42, wherein said first and second platens are different from each other.

44. A method for manufacturing a semiconductor device in accordance with claim 42, wherein at least one of the steps for polishing using said first and second platens uses a polishing pad containing fixed abrasive powder.

45. A method for manufacturing a semiconductor device, comprising the steps of:

forming a first insulating film on a substrate;

forming a second insulating film on said first insulating film;

forming a first via hole in said second insulating film and a second via hole in said first insulating film;

forming a first conductor film so as to be extended from both of said second and first via holes onto said second insulating film surface;

forming a second conductor film so as to be laminated on said first conductor film and extended from both of said second and first via holes onto said second insulating film surface;

polishing said second conductor film; and polishing said first conductor film at a polishing rate of not less than five times the polishing rate for said second insulating film.

* * * * *